United States Patent [19]

Muller

[11] Patent Number: 4,644,494

[45] Date of Patent: Feb. 17, 1987

[54] SOLID STATE MEMORY FOR AIRCRAFT FLIGHT DATA RECORDER SYSTEMS

[75] Inventor: Hans R. Muller, Redmond, Wash.

[73] Assignee: Sundstrand Data Control, Inc., Redmond, Wash.

[21] Appl. No.: 577,215

[22] Filed: Feb. 6, 1984

[51] Int. Cl.[4] .......................... G06F 3/00; G06F 13/00
[52] U.S. Cl. .................................................... 364/900
[58] Field of Search ... 364/200 MS File, 900 MS File, 364/464, 466; 365/52, 53

[56] References Cited

U.S. PATENT DOCUMENTS

| | | | |
|---|---|---|---|
| 3,753,244 | 8/1973 | Sumilas | 364/200 |
| 4,307,455 | 12/1981 | Juhasz et al. | 364/900 |
| 4,355,376 | 10/1982 | Gould | 365/200 |
| 4,408,306 | 10/1983 | Kuo | 365/218 |
| 4,409,670 | 10/1983 | Herndon et al. | 364/900 |
| 4,421,977 | 12/1983 | Kittredge | 364/900 X |
| 4,471,441 | 9/1984 | Check Jr. | 364/900 X |

OTHER PUBLICATIONS

Proceedings of the 11th Symposium, "Aircraft Integrated Data Systems", Sep. 22-24, 1981, at DFVLR in Koln—Porz.
"Solid—State Flight Incident Recorder", by D. Amundson, Sperry Univac, St. Paul, USA presented at above—referenced symposium.
"Solid State Crash Survivable Flight Data Recorders for Mishap Investigation", by H. R. Ask, Hamilton Standard, Windsor Locks, USA, above—referenced symposium.

Primary Examiner—Harvey E. Springborn
Attorney, Agent, or Firm—Christensen, O'Connor, Johnson & Kindness

[57] ABSTRACT

A memory unit for a aircraft flight data recorder system uses an electronically erasable solid state memory for storing the flight data and a memory controller circuit are housed in a penetration resistant, thermally insulated enclosure. Power dissipation within the insulated enclosure is minimized by an external switching circuit that applies operating potential to the solid state memory only when data are being transferred to and from the memory circuit. A data protection circuit, located within the insulated enclosure inhibits memory write and erase operations whenever the system operating potential falls below a predetermined level. In continuously storing flight data, the oldest stored data is overwritten with newly arriving flight data and the memory controller maintains an erased boundary that defines the beginning and end of the recorded data. A power monitor circuit, located outside the insulated enclosure, resets the memory controller to the erased boundary following a power interruption. A dedicated portion of the memory space is utilized to store the address of faulty memory locations (detected during the data storage sequence) and stores the beginning and ending memory address of selected portions of the data record. The memory controller is sequenced to skip both the faulty memory locations and memory storage locations associated with the selected portions of the data record when new flight data is being stored.

61 Claims, 7 Drawing Figures

SOLID STATE MEMORY FOR AIRCRAFT FLIGHT DATA RECORDER SYSTEMS

Technical Field

This invention relates to aircraft flight data recorder systems. More particularly, this invention relates to an environmentally protected, high reliability solid state memory arrangement suitable for use as a crash-survivable memory unit of an aircraft flight data recorder system.

BACKGROUND OF THE INVENTION

Various advances in the technologies that relate to the fabrication and application of solid state memory devices and the applications thereof to circuit design have resulted in numerous circuit arrangements for temporarily or permanently storing digitally encoded data. Although these advances have found widespread application, stringent design restraints have heretofore prevented or substantially limited the use of solid state memory devices for the recording of certain data. One example of a situation wherein solid state memories have not found widespread application is the crash survivable unit of an aircraft flight data recorder system wherein a signal acquisition unit processes various signals that are representative of the flight data to be recorded and supplies various command messages and digitally encoded signals representative of the flight data to the crash survivable memory unit. Since the crash survivable memory unit must retain the stored flight data when subjected to high impact (penetration) forces attendant an aircraft crash and, if the aircraft burns, must retain the stored flight data under exposure to high temperature environment, current flight data recorder crash survivable memory units generally include a penetration-resistant metal housing that contains a mechanism for recording the flight data on magnetic tape. To provide thermal isolation, the magnetic tape mechanism is typically mounted in the central portion of the housing and is encased by insulating material.

Prior art crash survivable memory units of this type exhibit several disadvantages and drawbacks. For example, such memory units are often larger and heavier than desired. Further, because such crash survivable memory units require utilization of numerous precisely machined and precisely mounted components, both the initial cost of the memory unit and the cost of maintenance is higher than desired.

SUMMARY OF THE INVENTION

The present invention provides a solid state memory unit that is particularly suited for use as a flight data recorder crash survivable memory unit that is relatively small, light, of relatively low initial cost and is easily and economically maintained. In accordance with the invention, these features are provided while simultaneously protecting the stored flight data if the aircraft utilizing the invention crashes and burns, as well as protecting the stored data during aircraft power interruptions and fluctuations that often occur during an aircraft emergency or crash.

To accomplish the above goals, the memory unit of this invention essentially is a self-contained sequential machine that synchronously sequences to perform all memory management and command tasks that are necessary to store digitally encoded flight data in one or more solid state electronically erasable read-only memories. With respect to usage as the crash survivable memory unit of a flight data recorder system, the invention is configured to operate in conjunction with a flight data recorder signal acquisition unit which supplies digitally encoded command messages (supervisory signals) and digitally encoded flight data to the crash survivable memory unit via a serial data bus. The command messages are decoded by a memory controller that is located in the crash survivable memory unit, with the memory controller sequencing to load the flight data into the memory space defined by one or more electronically erasable read-only memories (EEPROMS). In storing flight data in the EEPROMS, the memory controller repeatedly cycles through the EEPROM address space so as to overwrite the oldest stored flight data with newly acquired flight data. To effect this overwriting and to provide a detectable boundary between the newest and oldest stored flight data, each time the invention operates to write flight data into memory it sequences to erase a portion of the EEPROM memory space that extends beyond the space to be occupied by the flight data being loaded. This erased boundary or marker is utilized by the invention to initialize the address pointer of the memory controller when power is applied to the crash survivable memory unit after a period of time in which the system is turned off or after a temporary power interruption.

To protect recorded flight data from being erased during power interruptions or periods of low operating potential, and to prevent the memory unit from storing improper data under those same conditions, the invention includes an erase/write protection circuit that operates to disable the EEPROM whenever the system operating potential is below a predetermined level. This erase/write protection circuit, the memory controller, the memory (EEPROMS) and an address decoding network that decodes the address signal supplied by the memory controller are packaged within a thermal isolating, impact resistant environmental enclosure. To minimize the power dissipated by the circuits within the environmental enclosure, the invention includes a power regulator and switch unit that is mounted outside the environmental enclosure and supplies operating potential to the EEPROMS (and associated memory control circuits) only when flight data is being transferred between the memory controller and the EEPROMS. A power monitor circuit, which detects power interruptions and fluctuations to activate the erase/write protection circuit is also mounted outside the environmental enclosure.

To minimize maintenance requirements and increase the reliability of the stored flight data, each time the memory controller operates to store data in the EEPROMS, the data transmitted to the memory is compared with the data actually stored to thereby detect inoperative memory locations. The addresses of memory locations that do not properly store data are stored in a reserved portion of the EEPROM memory space which serves as a "faulty address directory." As the memory controller sequences to store data, the faulty address directory is searched and the memory controller skips addresses corresponding to faulty memory locations.

In addition to providing the above-noted features, the crash survivable memory unit of this invention is selectively operable to preserve a flight data record that otherwise would be erased during later portions of the aircraft flight. In this regard, it is often desirable to maintain a flight data record during short periods of irregular aircraft behavior. To prevent such data from being overwritten by flight data that is supplied during a subsequent portion of the aircraft flight, a portion of the memory space of the EEPROM is reserved to define a "special event directory" for storing the beginning and ending address of flight data to be preserved. The beginning and ending address for such a flight data record is stored in the special event directory by the memory controller upon receipt of a command message from the flight data recorder acquisition system. As the memory controller subsequently sequences to store data in the EEPROM, the special event directory is searched and newly arriving flight data is not written into the portion of the EEPROM memory space that contains the data being preserved.

In a disclosed detailed embodiment of the invention, six EEPROMS of the type which store or erase several bytes (words) of data during a single write and erase cycle are utilized. In this arrangement, the EEPROMS are interconnected as two sets of 3 EEPROMS with the first set forming the memory space associated with even valued address signals and the second set forming the memory space associated with odd valued addresses. This feature further decreases power dissipation within the environmental enclosure (and hence temperature rise) and increases the effective memory write and erase rate by permitting data to be simultaneously written into (or erased from) consecutive even-valued and odd-valued addresses during each write (or erase) cycle. In addition, in this detailed embodiment of the invention, the memory controller sequence that is effected following a power interruption stores a signal in the EEPROM memory space that serves to identify the time at which the power interruption occurred.

BRIEF DESCRIPTION OF THE DRAWING

These and other aspects and advantages of the invention will be better understood upon reading the following description of the invention in conjunction with the drawing wherein.

DETAILED DESCRIPTION OF THE INVENTION

Figure 1:
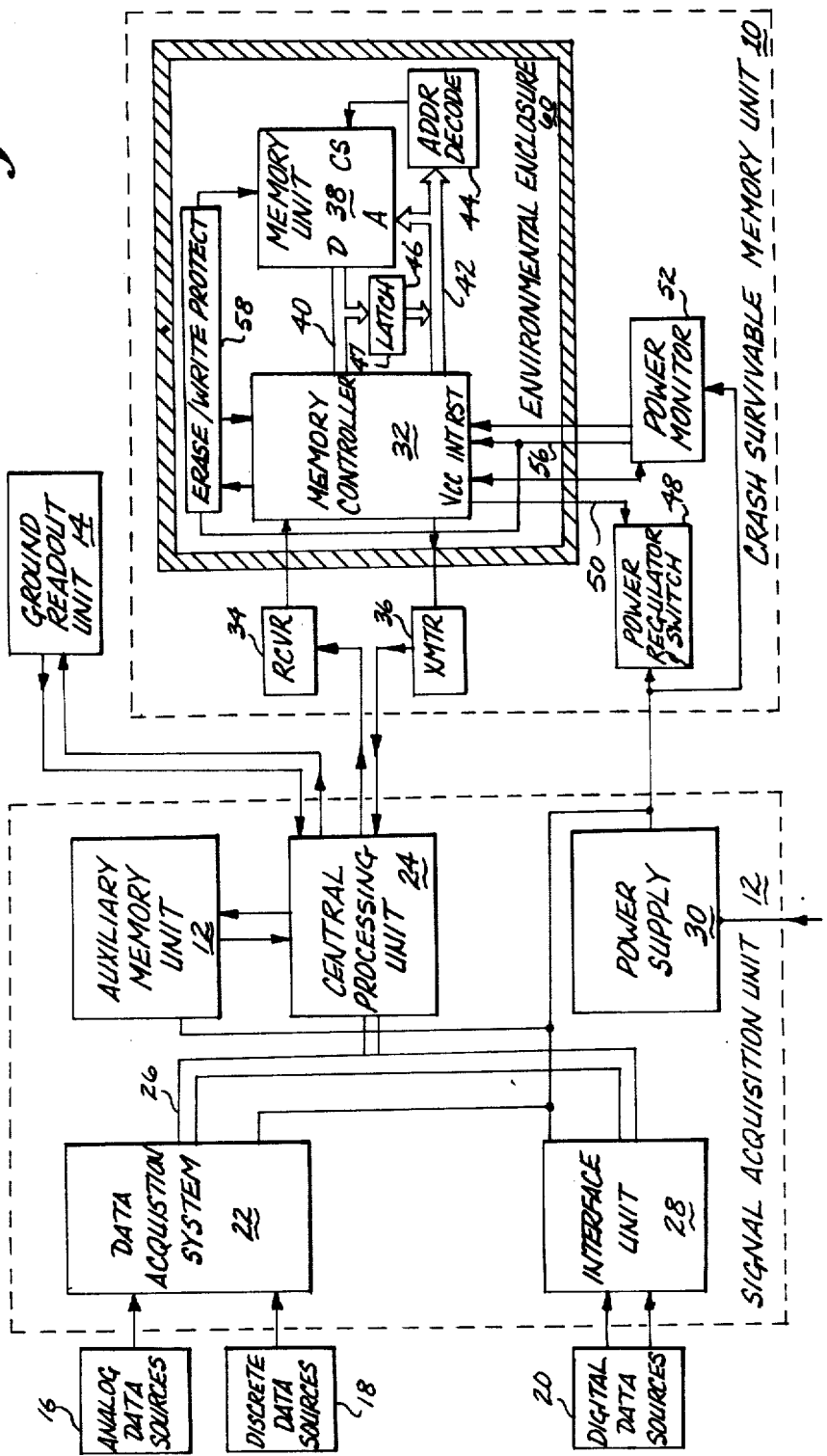
FIG. 1 is a block diagram that illustrates a flight data recorder system which includes a crash survivable memory unit configured in accordance with this invention.

The block diagram of FIG. 1 illustrates a flight data recorder system that employs a solid state crash survivable memory unit 10 that is configured in accordance with this invention for storing parametric data that is useful in determining the cause of various aircraft mishaps, including crashes. In addition to crash survivable memory unit 10, the depicted flight data recorder system includes a signal acquisition unit 12, which acquires and processes various parametric data from conventional aircraft sensors and systems and a ground readout unit 14, which is utilized to periodically retrieve stored data from crash survivable memory unit 10 and signal acquisition unit 12. As is indicated by the blocks denoted by the numerals 16 and 18, respectively, the parametric data supplied to signal acquisition unit 14 includes analog data signals and discrete data signals. As is known in the art, analog signals typically accessed and utilized by a flight data recorder system include signals such as 3-phase alternating current signals representative of the angular position of various aircraft components and control surfaces (i.e., "synchro signals"); ratiometric signals such as signals representative of the linear displacement of various aircraft control surfaces that are provided by linear variable differential transformers; and various other time-varying signals representative of the current state of an aircraft attitude or control relationship. Discrete data signals are signals that assume one of two predetermined levels (i.e., "on" or "off"; "high" or "low"). As is known in the art, discrete signals that are useful in a flight data recorder system are supplied by a variety of sources including switches that are manually or automatically operated to provide signals representative of the functional state of an aircraft system or device or to indicate the presence of a crew initiated command.

A data acquisition system 22, which is included in signal acquisition unit 12, receives the analog and discrete data signals supplied by sources 16 and 18. Data acquisition system 22 is interconnected with a central processing unit 24 by means of an information bus 26 and converts analog and discrete parametric data supplied by sources 16 and 18 to the particular digital format employed by the flight data recorder system. Generally speaking, the signal conversion process effected by data acquisition system 22 includes gain scaling and analog-to-digital (A-D) conversion wherein: CPU 24 provides a signal selection command to data acquisition system 22; data acquisition system 22 samples the selected analog or discrete signal, converts the selected signal to the desired digital format and provides CPU 24 with an interrupt signal via information bus 26; and CPU 24 accesses the digitally encoded signal. A data acquisition system that performs these functions and is configured specifically for use in a flight data recorder system that employs a crash survivable memory unit of the present invention is disclosed in a U.S. patent application by Edward Stephenson Ser. No. 576,538, filed Feb. 3, 1984, and entitled "Data Acquisition System." That patent application is assigned to the assignee of this invention.

As is shown in FIG. 1, information bus 26 also interconnects CPU 24 with an interface unit 28 which receives digitally encoded signals from a variety of digital data sources that are indicated by block 20 of FIG. 1. Depending upon the application in which the flight data recorder system is utilized, various digital data signals can be supplied to interface unit 28. In this regard, virtually any digital data signal that is important to diagnostically determining aircraft performance or the source of a mishap can be supplied to interface unit 28 for storage within the flight data recorder system of FIG. 1. For example, conventional flight data recorder systems typically record digitally encoded signals provided by one or more of the aircraft navigation systems.

In a current realization of the type of flight data recorder system depicted in FIG. 1, interface unit 28 is an avionic multiplex data bus interface that is constructed to MIL-STD-153/1553B. Interface units constructed to this military standard include a remote terminal section and a highspeed sequential state controller which is programmed to access the desired digital data source, provide any required signal conditioning, and store the resultant signal in a random access memory unit that is located within interface unit 28 and acts as a buffer memory. CPU 24 is programmed to transmit data request signals to interface unit 28 via information bus 26 and to asynchronously access signals provided by interface unit 28. The high-speed sequential state controller within interface unit 28 arbitrates conflicting signal access commands that can be generated by CPU 24 and the remote terminal section of interface unit 28.

As is indicated in the preceding paragraphs, CPU 24 functions to control data acquisition system 22 and interface unit 28 for the accessing of data for storage within the flight data recorder system. In addition, CPU 24 processes the data supplied by data acquisition system 22 and interface unit 24 and selectively supplies information to be recorded to: (a) memory space within CPU 24; or (b) crash survivable memory unit 10; or (c) an auxiliary memory unit 30, which is located in signal acquisition unit 12. In this regard, in the previously mentioned current realization of the type of flight data recorder system depicted in FIG. 1, CPU 24 operates to: (a) store data useful in determining the cause of an aircraft mishap in crash survivable memory unit 10; (b) store individual aircraft tracking data (obtained by monitoring parameters such as the aircraft NZCG [normal acceleration parameter]) in a nonvolatile solid state memory located within CPU 24; and (c) store structural load environmental data and engine usage data in auxiliary memory unit 12.

In the referenced current realization of the type of flight data recorder system depicted in FIG. 1, CPU 24 includes a type F9450 micro-processor circuit, manufactured by Fairchild Semiconductor of Mountain View, Calif.; an 8-kilobit nonvolatile memory for storing the individual aircraft tracking data; a read-only memory which serves as a program memory for CPU 24; and three serial input/output (I/O) ports for interconnecting CPU 24 with auxiliary memory unit 12, ground readout unit 14 and crash survivable memory unit 10. These components are interconnected and sequenced so that CPU 24 sequentially accesses the signals supplied by data acquisition system 22 and interface unit 28; performs signal processing (e.g., data compression) that is necessary for storage of data within the nonvolatile memory of the CPU, crash survivable memory 10 and auxiliary memory unit 12; and facilitates transfer of data to crash survivable memory unit 10, auxiliary memory unit 12 and ground readout unit 14 via the three previously mentioned serial I/O ports, which provide duplex operation using fixed protocol message structure.

Referring still to FIG. 1, signal acquisition unit 12 also includes a power supply 30, which supplies operating power to crash survivable memory unit 10, auxiliary unit 12, data acquisition system 22, CPU 24 and interface unit 28. As shall be described relative to crash survivable memory unit 10, each unit or module that is powered by power supply 30 can include any additional regulation and power control that is required or desired.

Auxiliary memory unit 12 generally includes a nonvolatile memory (for storing the structural load environmental data and engine usage data supplied by CPU 24) and a controller circuit (with associated memory addressing and control circuits) for receiving the serial data supplied by CPU 24 and storing that data in the nonvolatile memory. In the previously mentioned current realization of a flight data recorder system of the type depicted in FIG. 1, auxiliary memory unit 12 is constructed in the same manner as crash survivable memory unit 10, with the difference between crash survivable memory unit 10 and auxiliary memory unit 12 of that realization being inclusion of a substantially larger nonvolatile memory within auxiliary memory unit 12 (e.g., 4 Megabits as compared to 384 kilobits, in one application).

Ground readout unit 14 of FIG. 1 is connected to CPU 24 (or, alternatively, directly to crash survivable memory unit 10) whenever data stored by the flight data recorder system is to be extracted for subsequent analysis or processing in remotely located ground based equipment such as a programmed general purpose computer. In this regard, ground readout unit 14 is configured to interact with CPU 24 (or crash survivable memory unit 10) for sequentially accessing mishap data stored in crash survivable memory unit 10, the individual aircraft tracking data that is stored in the nonvolatile memory of CPU 24 and the structural load and engine performance data that is stored in auxiliary memory unit 12. In the previously mentioned current realization of the type of flight data recorder system depicted in FIG. 1, ground readout unit 14 includes a microprocessor based system (with associated random access and read-only memory) which is programmed to interact with CPU 24 of signal acquisition unit 12 (or, alternatively, to directly interact with crash survivable memory unit 10) for transferring data stored in the flight data recorder system to magnetic discs. Operator control is effected by means of a small keyboard or pad. An alpha numeric liquid crystal display is utilized for indication of the selected operating mode (e.g., unloading auxiliary memory unit 12 or crash survivable memory unit 10) as well as providing operating instructions or "prompts" that are generated by the microprocessor based system of ground readout unit 14 and/or CPU 24 of signal acquisition unit 12 to assist the operator of ground readout unit 14.

Referring still to FIG. 1, the crash survivable memory unit 10 of this invention includes a memory controller 32 which receives serially encoded digital data from CPU 24 of signal acquisition unit 12, i.e., the data representing mishap information that is to be stored within crash survivable memory unit 10 and CPU generated commands that are necessary to control the operation of memory controller 32. In the arrangement of FIG. 1, a conventional serial data receiver 34 (e.g., an integrated circuit of the type known as a universal asynchronous receiver-transmitter) couples the data supplied at a serial input-output port of CPU 24 to a serial data input port of memory controller 32. Duplex communication between CPU 24 and memory controller 32 is effected by a conventional serial data transmitter 36, which receives serially encoded data from a serial input-output port of memory controller 32 and couples that data to CPU 24 of signal acquisition unit 12. The signals coupled from memory controller 32 to CPU 24 include various control signals, e.g., an indication that the controller 32 is ready to receive data; an indication that previously transmitted data was not properly received; and various other control signals that are known to those skilled in the art and will be recognized upon understanding the hereinafter described operation of crash survivable memory unit 10. In addition, when the information stored in crash survivable memory unit 10 is extracted by means of ground readout unit 14, memory controller 32 supplies the stored data either directly to ground readout unit 14 or to CPU 24 (along with associated acknowledgment and control signals) via transmitter 36. To facilitate loading data into (and extracting data from) crash survivable memory unit 10, a portion of a random access memory, that is included in memory controller 32, serves as a buffer memory. For example, in the previously referenced current realization of the flight data recorder system of FIG. 1, a portion of a random access memory contained in memory controller 32 is utilized to serve as two 32-byte storage buffers. When data is transmitted to memory controller 32 for storage within the memory circuits of crash survivable memory unit 10, one of the 32-byte buffer memories provides intermediate storage of the incoming serial data while data previously stored in the second 32-byte buffer memory is being written into the memory circuits of crash survivable memory unit 10. In a like manner, when data is being read from crash survivable memory unit 10 by ground readout unit 14, one of the 32-byte buffer memories provides intermediate storage for data supplied to memory controller 32 by the memory circuits of crash survivable memory unit 10 while the second 32-byte buffer section is either being read directly by ground readout unit 14 or, in the alternative, is being read by CPU 24 of signal acquisition unit 12 and supplied to ground readout unit 14.

The portion of the random access memory contained in memory controller 32 that is not utilized as buffer memory for loading data into and extracting data from crash survivable memory unit 10 is used for various computation and control processes that enable memory controller 32 to effect the various operations described in more detail herein. The control processes (or sequencing) of memory controller 32 is directed by program instructions that are stored in a read-only memory that is also contained in memory controller 32. As will be recognized by those skilled in the art, numerous integrated circuits are available that contain random access memory, read-only memory and associated control circuits for accomplising the described data transfer operations as well as the hereinafter described provisions for controlling data transfer between memory controller 32 and the memory circuits of crash survivable memory unit 10. In this regard, memory controller 38 of the previously mentioned current realization of the flight data recorder system of FIG. 1 utilizes a 80C51 integrated circuit microcontroller manufactured by Intel Corporation of Santa Clara, Calif. As will be recognized by those skilled in the art, various circuit arrangements other than single chip integrated circuits can be utilized for memory controller 32, one example being an 80C31 Intel Corporation integrated circuit, which is used with an external program (read-only) memory.

Regardless of the exact configuration of memory controller 32, crash survivable memory unit 10 includes a memory unit 38 for storing the data supplied to crash survivable memory unit 10 by signal acquisition unit 12. As is illustrated in FIG. 1, a data bus 40 interconnects memory controller 32 and memory unit 38 to facilitate transfer of data between the memory controller and the memory unit and an address bus 42 interconnects memory controller 32 with memory unit 38 for addressing the memory unit when data are loaded into the memory unit (written) and when data are extracted from the memory unit (read).

In accordance with the invention, memory unit 38 is a solid state erasable read-only memory (EEPROM) configured for continuously overwriting the oldest stored data. Since current technology limits the memory capacity of EEPROMS to less than the memory requirements of a typical flight data recorder system, memory unit 38 will generally include a plurality of separate EEPROMS that collectively provide the required memory capacity. As is illustrated in FIG. 1, address bus 42 of such an arrangement is interconnected with an address decoder 44 that decodes the address signal supplied by memory controller 32 and supplies a "chip select" signal to memory unit 38 to activate the EEPROM that includes the memory space being addressed by memory controller 32. For example, in the hereinafter discussed, more detailed embodiment of crash survivable memory unit 10, memory unit 38 includes six 64-kilobit EEPROMS with memory locations having even numbered addresses being defined within a set of three of the EEPROMS and memory locations having odd addresses being defined within the remaining set of three EEPROMS. In that arrangement, the least most significant and the two most significant bits of the address signal are coupled to address decoder 44, which contains logic circuits for: (a) detecting whether the selected address is even or odd (and hence which of the two sets of EEPROMS is being addressed); and (b) determining which of the three EEPROMS in the selected set (even or odd address) is to be selected.

The embodiment of the invention depicted in FIG. 1 includes an address latch 46 that is connected to the data bus 40 and address bus 42. Address latch 46 is required only in embodiments of the invention wherein memory controller 32 provides signals wherein a portion of the address signal is multiplexed with the data signal. For example, the previously mentioned Intel 80C51 microcontroller multiplexes the eight least significant bits of the address signal onto the data bus. In such an arrangement, address latch 46 is activated by the memory controller address line enable signal (indicated by connection 47 in FIG. 1) to demultiplex the combined address and data signal.

In addition to the above-discussed provisions for data retention, crash survivable memory unit 10 of FIG. 1 includes circuitry for providing operating power and monitoring the operating power being provided to: (a) minimize the power dissipation of memory controller 32 and memory unit 38 (and the associated address decoder 44 and address latch 46); (b) reset memory controller 32 after power interruptions of both short and long duration; and (c) prevent both accidental erasure of flight data stored in memory unit 38 and accidental loading of false data into memory unit 38 during temporary power interruptions. In this regard, as shall be described in more detail relative to FIG. 2, operating power is supplied from power supply 30 of signal acquisition unit 12 to a series-type voltage regulator that is located in a power regulator and switch unit 48. The output of the voltage regulator is supplied to switching circuitry that is located in power regulator and switch unit 48 and is responsive to a signal supplied to power regulator and switch 48 from memory controller 32 (via an interconnection 50 in FIG. 1). The switching circuitry within power regulator and switch unit 48 supplies operating power to a power monitor unit 52, which, in turn, continuously powers memory controller 32 and supplies power to the remaining circuitry of crash survivable memory unit 10 only when data is transferred into or out of memory unit 38 (i.e., "on demand").

Although various techniques can be employed for detecting data transfer between memory unit 38 and memory controller 32 and providing a signal for activating the switch circuitry of power regulator and switch unit 48, in the previously mentioned current realization of the system of FIG. 1, memory controller 32 is programmed to provide a switch activation signal whenever memory controller 32 decodes a signal supplied by CPU 24 of signal acquisition unit 12 that requires data transfer between memory controller 32 and memory unit 38.

Figure 2:
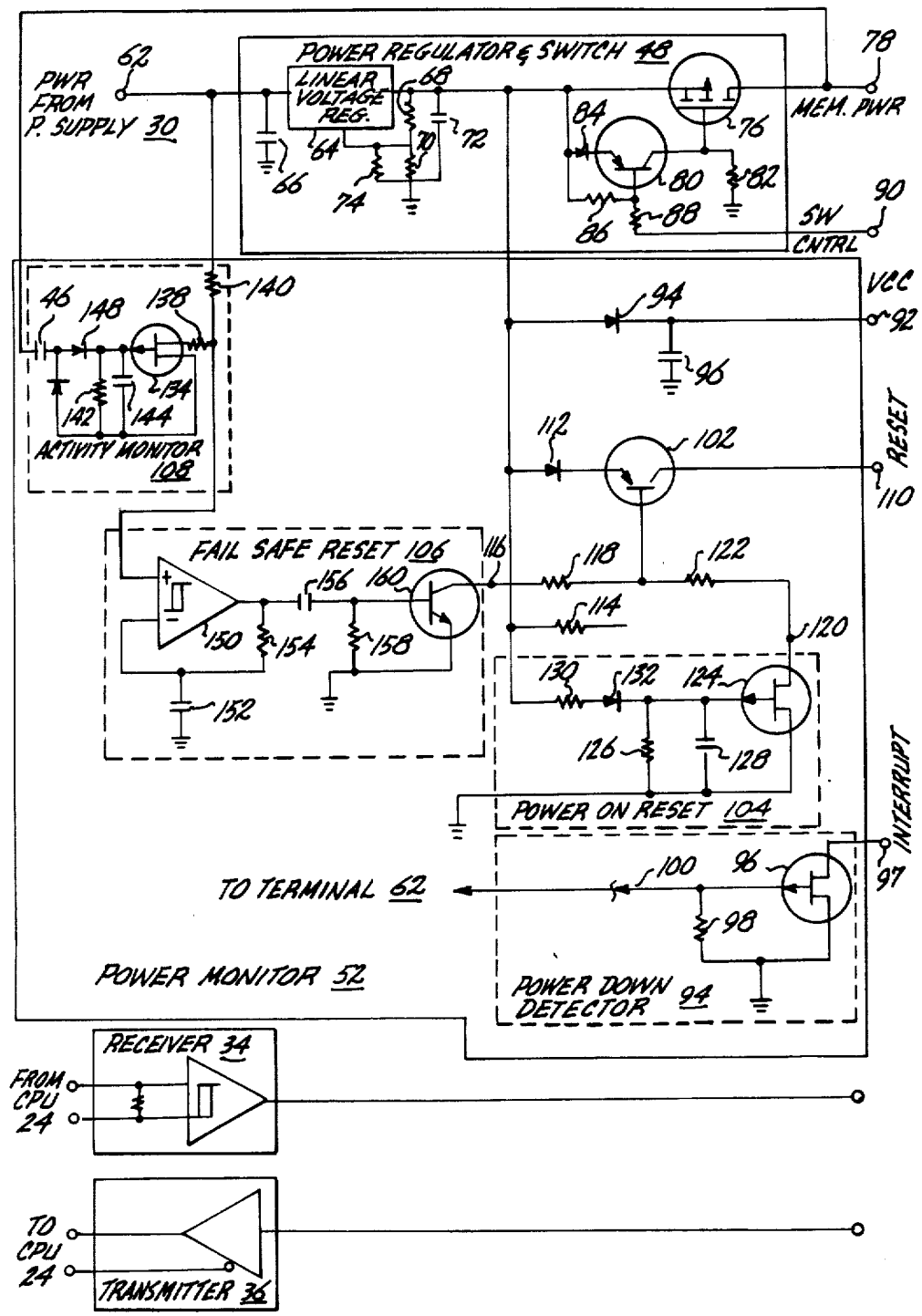
FIG. 2 is a schematic diagram of the crash survivable memory unit circuitry that is located outside the environmental enclosure.

As shall be described in more detail relative to FIG. 2, power monitor unit 52 includes circuitry for continuously powering memory controller 32 of crash survivable memory unit 10. Power monitor 52 further includes circuitry for supplying a reset pulse to memory controller 32 via a reset line 54 whenever the flight data recorder system of FIG. 1 is initially turned on and when system power is supplied (via power supply 30 and power regulator and switch 48), but memory controller 32 is inactive for more than a normal period of time. In addition, power monitor 52 includes circuitry for supplying an interrupt signal to memory controller 32 (via a connection 56 in FIG. 1) whenever the voltage supplied by power supply 30 of signal acquisition unit 12 (and hence power regulator and switch 48 of crash survivable memory unit 10) falls below a predetermined level. In the arrangement of FIG. 1, the interrupt signal supplied by power monitor 52 is also connected to an erase/write protection circuit, which is also connected for receiving the memory control lines and memory read and write enable lines of memory controller 32. Erase/write protection circuit 58 is arranged to inhibit both the read and write functions of memory unit 38 and disable the memory control lines when the power supply voltage is low to thereby prevent the storage of false data in memory unit 38 that can result due to low voltage operation of various system circuitry. A suitable erase/write protection circuit is included in the arrangement of FIG. 3 and discussed in subsequent paragraphs herein.

As is indicated in FIG. 1, the circuitry of crash survivable memory unit 10 that is necessary for retention of flight data (memory controller 32, memory unit 38, address decoder 44, address latch 46 and erase/write protection circuit 58) is enclosed in an environmental enclosure 60. As is known in the art, environmental enclosures for protecting the recording medium of a flight data recorder system are constructed to withstand penetration and exposure to the high temperature environment (a temperature on the order of 2000° F.) that can occur if the aircraft utilizing the flight data recorder system crashes and burns. An environmental enclosure that is designed specifically for use with a crash survivable memory unit that employs semiconductor memory devices is disclosed in patent application Ser. No. 529,831, filed Sept. 7, 1983, which is assigned to the assignee of this invention.

Several advantages and features of this invention can be readily appreciated in view of the block diagram representation of crash survivable memory unit 10 (FIG. 1). Firstly, utilizing semiconductor circuitry and including within environmental enclosure 60 only that circuitry that is necessary to record and protect stored flight data minimizes the power dissipated within environmental enclosure 60. This minimizes the temperature rise under normal operating conditions and, thus, allows the circuitry within environmental enclosure 60 to be thermally isolated from the surrounding environment. Component power dissipation and hence temperature rise within environmental enclosure 60 is further reduced through the above-discussed operation of power regulator and switch unit 48, which supplies operating power to memory unit 38 (and all other circuitry within environmental enclosure 60 except memory controller 32) only when data is to be transferred between memory controller 32 and memory unit 38. In addition, the above-discussed operation of address latch 46 and erase/write protection circuit 58 ensures that memory unit 38 contains correct flight data and ensures that stored data are protected during power interruption, including power interruption accompanying an aircraft mishap and crash.

Reference is now made to FIG. 2, which illustrates circuitry suitable for use as the circuitry that is located outside environmental enclosure 60 of the crash survivable memory unit 10 that is shown in FIG. 1 (i.e., serial data receiver 34, serial data transmitter 36, power regulator and switch unit 48 and power monitor 52). In the arrangement of FIG. 2, serial data receiver 34 and serial data receiver 36 are a conventional type RS 422A differential data receiver and transmitter. Such devices are well known in the art and include, for example, the $\mu$A9636 dual data receiver and $\mu$A9637 dual data transmitter that are manufactured by Fairchild Semiconductor of Mountain View, Calif.

In the power regulator and switch unit 48 depicted in FIG. 2, the operating voltage supplied by power supply 30 of signal acquisition unit 12 is coupled to an input terminal 62, which is connected to the input terminal of a conventional linear voltage regulator 64. A filter capacitor 66 is connected between the input terminal of linear voltage regulator 64 and circuit common. Since the operating voltage supplied by power supply 30 of signal acquisition unit 12 can be supplied at a voltage that requires a relatively small voltage drop across linear voltage regulator 64, minimal filtering is required and filter capacitor 66 generally can be a relatively small valued tantalum capacitor. Supplying a preregulated operating voltage to terminal 62 that results in a small voltage drop across linear voltage regulator 64 is also advantageous in that the power dissipated by the regulator circuit is minimized. This ensures that the regulator circuit is capable of operating at relatively high ambient temperature. Resistors 68 and 70, which are serially connected between the output terminal of linear voltage regulator 64 and circuit common, establish the output voltage of linear voltage regulator 64. In this regard, the junction between resistors 68 and 70 is connected to linear voltage regulator 64 to provide the required output sensing (feedback). A capacitor 72 and a resistor 74 are serially connected from the output terminal of linear voltage regulator 64 to the junction between resistors 68 and 70 to aid in preventing surge currents when the switch portion of power regulator and switch 48 is activated to provide operating power to the memory circuits of crash survivable memory unit 10.

In the power regulator and switch 48 of FIG. 2, the switch for providing operating current to the memory circuits of crash survivable memory unit 10 in response to a control signal supplied by memory controller 32 (FIG. 1) includes a p-channel metal oxide semiconductor enhancement mode field effect transistor (MOSFET) 76, having the source electrode thereof connected to the output terminal of linear voltage regulator 64. The drain electrode of MOSFET 76 is connected to a memory power terminal 78, which is connected to supply power to all components within environmental enclosure 60 of FIG. 1, except memory controller 32. The gate electrode of MOSFET 76 is connected to the junction between the collector electrode of a pnp transistor and a resistor 82 that is connected between the collector of pnp transistor 80 and circuit common. A diode 84 is connected between the output terminal of linear voltage regulator 64 and the emitter electrode of pnp transistor 80. Resistors 86 and 88 are serially connected between a switch control terminal 90 that receives the control signal generated by memory controller 32 (FIG. 1) and the output terminal of linear voltage regulator 64, with the junction between resistors 86 and 88 being connected to the base electrode of pnp transistor 80.

Figure 3:
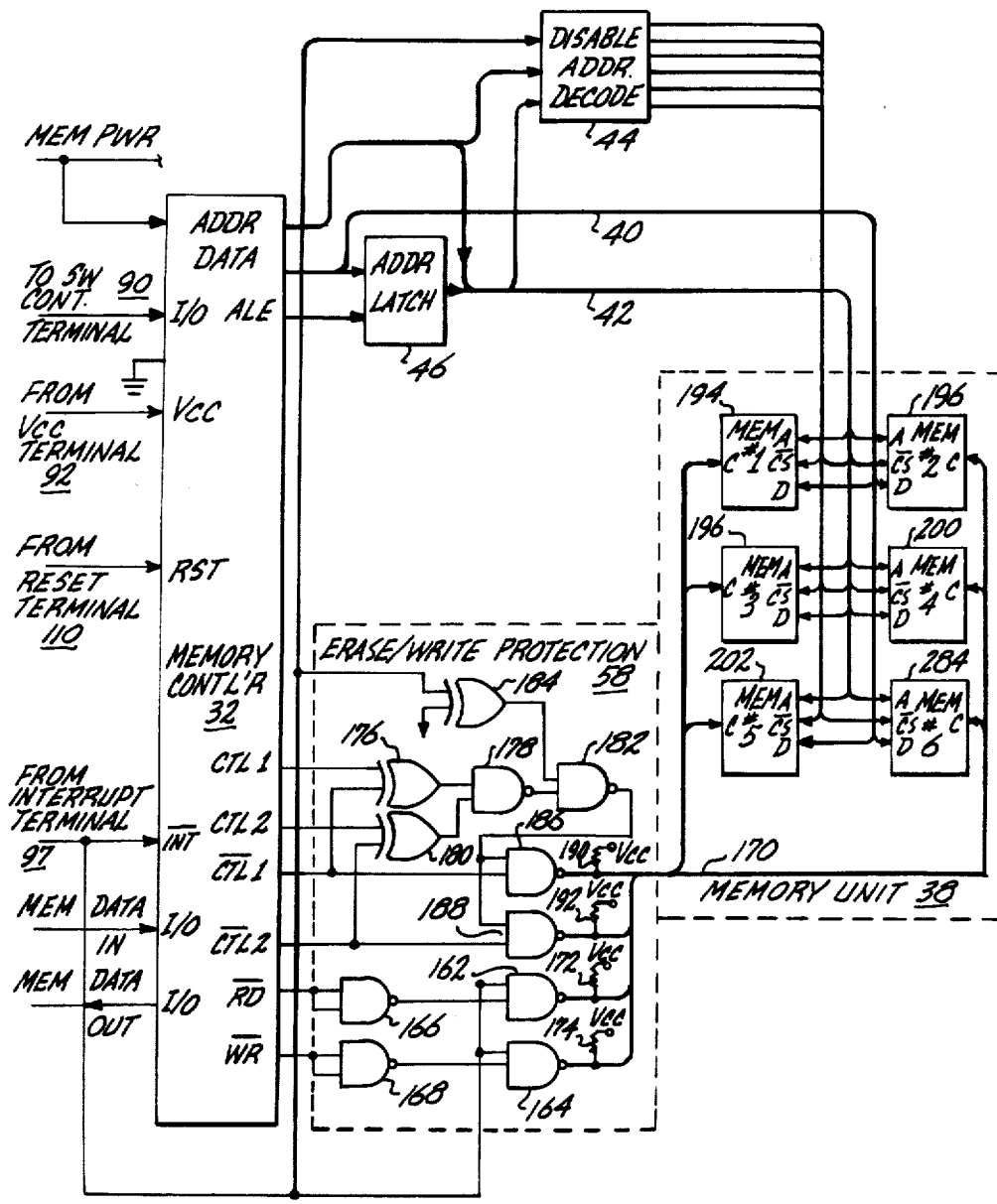
FIG. 3 is a schematic diagram of the crash survivable memory unit circuitry that is located within the environmental enclosure.

In operation, when the switch control signal supplied to terminal 90 by memory controller 32 (FIG. 1; FIG. 3) is at or near circuit common potential (i.e., logic level low), pnp transistor 80 conducts (i.e., is "turned on"). This maintains the gate-source voltage of MOSFET 76 below the gate threshold voltage so that substantially no current can flow between the source and drain electrodes thereof (i.e., MOSFET 76 is in the off state). When memory controller 32 supplies a positive voltage level to switch control terminal 90 (logic level high), pnp transistor 80 is turned off to establish the gate voltage of MOSFET 76 at a level that exceeds the gate threshold voltage. This switches MOSFET 76 to an on state wherein current flows from the output terminal of linear voltage regulator 64 through the drain-to-source path (channel) of MOSFET 76 and hence to the circuits of crash survivable memory unit 10 that are powered by the switch portion of power regulator and switch 48.

As previously mentioned relative to FIG. 1, power monitor 52 includes: (a) circuitry for continuously powering memory controller 32 during power interruptions of relatively short duration; (b) circuitry for resetting memory controller 32 when the flight data recorder system is initially activated and when power interruptions or other conditions cause memory controller 32 to remain inactive for more than a normal period of time; and, (c) circuitry for providing an interrupt signal to memory controller 32 and erase/write protection circuit 58 whenever the output level of power supply 30 of signal acquisition unit 12 (and hence the operating voltage supplied to crash survivable memory unit 10) falls below a predetermined level. In the arrangement of FIG. 2, the operating voltage ($V_{cc}$) for memory controller 32 is supplied to a terminal 92 by means of an isolation diode 94 having the cathode thereof connected to terminal 92 and the anode connected to the output terminal of linear voltage regulator 64. A capacitor 96, which is connected between circuit common and the cathode of diode 94, charges when the flight data recorder system is initially energized and stores charge sufficient to maintain $V_{cc}$ at or near the proper voltage level during relatively short term power interruptions (e.g., interruptions of two to four seconds in duration).

In power monitor 52 of FIG. 2, the signal that interrupts operation of memory unit 32 and activates erase/write protection circuit 58 whenever the level of the operating voltage supplied by power supply 30 decreases below a predetermined level is supplied by a circuit identified as power down detector 94 in FIG. 2. The depicted power down detector 94 includes a p-channel field effect transistor (FET) 96 having the drain electrode thereof connected to a terminal 97 and the source electrode thereof connected to circuit common. A resistor 98 is interconnected between the gate electrode of FET 96 and circuit common. A zener diode 100, having the anode thereof connected to the gate electrode of FET 96 and the cathode connected to the output terminal of power supply 30 (via terminal 62 of FIG. 2), determines the voltage at which power down detector 94 supplies a interrupt signal to terminal 97. In particular, when the output voltage of power supply 30 is above the avalanche voltage of zener diode 100, current flows through resistor 98 and FET 96 is maintained in a nonconducting or off state. On the other hand, if the voltage supplied by power supply 30 falls below the avalanche voltage of zener diode 100, current ceases to flow through resistor 98 and FET 96 conducts to supply a logic level low signal to terminal 97. As shall be described relative to FIG. 3, whenever terminal 97 is at logic level low, operation of memory controller 32 is interrupted and erase/write protection circuit 58 is activated to prevent both inadvertent destruction of flight data stored in memory unit 38 and the storage of false data.

In power monitor 52 of FIG. 2, the previously mentioned signal for resetting memory controller 32 when the flight data recorder system is initially activated and whenever memory controller 32 is inactive for more than a normal period of time, is provided by a pnp transistor 102 that operates in conjunction with a power on reset circuit 104, a failsafe reset circuit 106 and an activity monitor circuit 108. In this arrangement, pnp transistor 102 is connected as a switch with the collector electrode thereof connected to a terminal 110, which supplies a reset pulse to memory controller 32 (FIG. 1; FIG. 3). The emitter electrode of pnp transistor 102 is connected to the output terminal of linear voltage regulator 64 by means of a diode 112 which is connected with the cathode thereof connected to the emitter electrode of pnp transistor 102. The base electrode of pnp transistor 102 is connected to the output terminal of voltage regulator 64 through a bias resistor 114. In addition, the base electrode of pnp transistor 102 is connected to an output terminal 116 of failsafe reset circuit 106 by means of a resistor 118 and is connected to an output terminal 120 of power on reset circuit 104 by means of a resistor 122.

As will be recognized by those skilled in the art, when the potential at output terminals 116 and 120 of failsafe reset circuit 106 and power on reset circuit 114 are at or near the potential supplied by linear voltage regulator 64, pnp transistor 102 is in the off state and the voltage level at reset terminal 110 will be at or near circuit common (logic level low). On the other hand, if the potential at output terminal 116 of failsafe reset circuit 106 or the potential at output terminal 120 of power on reset circuit 114 is at or near circuit common potential, pnp transistor 102 will turn on to supply a positive potential (logic level high) at reset terminal 110.

To cause pnp transistor 102 to supply a logic level high reset signal when the flight data recorder system is initially energized, power on reset circuit 104 includes a p-channel FET 124 having the drain and source electrodes thereof connected to output terminal 120 and circuit common, respectively. A resistor 126 and a capacitor 128 are connected in parallel between the gate electrode of FET 124 and circuit common, with a resistor 130 and diode 132 being serially connected between the gate electrode of FET 124 and the output terminal of linear voltage regulator 64. With this arrangement, when the flight data recorder system is initially energized, capacitor 128 controls the potential at the gate electrode of FET 124 in a manner that couples a logic level high (i.e., a "1") to reset signal to terminal 110. In particular, when the flight data recorder system is initially energized, current flows through capacitor 128 and the gate electrode of p-channel FET 124 is at a relatively low potential. This allows current to flow through the drain-to-source path (channel) of FET 124 and resistor 122, turning on transistor 102, which, in turn, couples a positive potential (logic level high) signal to reset terminal 110. As capacitor 128 of power on reset circuit 114 charges, the gate-source voltage of p-channel FET 124 increases to the FET pinch-off voltage and FET 124 turns off. When this occurs, substantially no current flows through resistor 122 and transistor 102 turns off to terminate the reset signal supplied at terminal 110. As will be recognized by those skilled in the art, the duration of the reset pulse supplied at terminal 110 is primarily determined by the RC time constant of resistor 130 and capacitor 128. By suitably selecting the values of these components, a reset pulse of duration sufficient to allow the various circuits of the flight data recorder system to stabilize prior to terminating the reset signal to memory controller 32 can be established.

The manner in which failsafe reset circuit 106 and activity monitor 108 are configured and operate to cause pnp transistor 102 to supply a reset pulse to terminal 110 whenever memory controller 32 is inactive for more than a normal period of time shall now be described. In this regard, activity monitor 108 includes a p-channel FET 134 having the drain electrode thereof connected to terminal 60 (the output terminal of power supply 30) via series connected resistor 138 and 140. A resistor 142 and a capacitor 144 are connected in parallel between the gate and source electrodes of p-channel FET 134, with the gate electrode being connected to the output terminal of linear voltage regulator 64 by means of a series connected capacitor 146 and diode 148. In addition, a diode 150 is connected between the source electrode of p-channel FET 134 and the junction between capacitor 146 and diode 148.

In view of the circuit arrangement of activity monitor 108, it can be noted that if the potential at terminal 78 (the memory power supplied by power regulator and switch unit 48) is at or near circuit common for a period of time that substantially exceeds the RC time constant of resistor 142 and capacitor 144, the gate-to-source voltage to p-channel FET 134 is also at or near circuit common potential. Under such a condition, p-channel FET 134 will be maintained in a conducting or on state, with the potential at the junction of resistors 138 and 140 being determined by the respective values of resistors 138 and 140 and being lower than the potential provided by power supply 30 (at terminal 62). If activity monitor 108 is initially in this state (i.e., no power supplied to crash survivable memory unit 10 via p-channel MOSFET 76) and power regulator and switch unit 48 operates to supply memory power to terminal 78, the potential supplied at terminal 78 causes current to flow through capacitor 146 and diode 148 to charge capacitor 144. As capacitor 144 charges, the gate to source potential of p-channel FET 134 increases to switch FET 134 to a nonconducting or off state. When power regulator and switch 48 operates to cease supplying memory power at terminal 78, diode 148 forces capacitor 144 to discharge through resistor 142 and p-channel FET 134 remains in the off state for a period of time primarily determined by the RC time constant of resistor 142 and capacitor 144. Thus, suitably establishing the RC time constant of resistor 142 and capacitor 144 will result in p-channel FET 134 being maintained in the off state unless the potential at terminal 78 remains at or near circuit common for a predetermined period of time. In the previously referred current realization of a flight data recorder system of the type depicted in FIG. 1, memory controller 32 activates power regulator and switch unit 48 at least twice a second. In that arrangement, the RC time constant of resistor 142 and capacitor 144 is established so that p-channel FET 134 is off if a positive potential is supplied to terminal 78 at this minimum repetition rate.

Failsafe reset circuit 106 of FIG. 2 is configured to activate pnp transistor 102 so as to supply a reset pulse to terminal 110 whenever P-channel FET 134 of activity monitor 108 turns on. In this regard, failsafe reset circuit 106 includes an oscillator circuit that is formed by a differential serial data receiver 150, a capacitor 152 and a resistor 154. Differential serial data receiver 150 can be identical to serial data receiver 34 with the noninverting input terminal thereof being connected to the junction between resistors 138 and 140 of activity monitor 108. Feedback is supplied via capacitor 152 and resistor 154, with resistor 154 being connected between the output and noninverting input terminals of receiver 150 and capacitor 152 being connected between circuit common and the inverting input terminal of receiver 150. With this arrangement, when crash survivable memory unit 10 is operating normally, memory controller 32 (FIG. 1; FIG. 3) activates power and regulator switch 48 at a repetition rate that maintains p-channel FET 134 of activity monitor 108 in a nonconducting or off state, which maintains the noninverting input terminal of receiver 150 at or near the circuit supply voltage to prevent oscillation of the circuit formed by receiver 150, capacitor 152 and resistor 154. When power regulator and switch unit 48 remains inactive for more than a normal period of time, p-channel FET 134 of activity monitor 108 turns on, causing receiver 150 to oscillate at a relatively low frequency. When this occurs, the signal supplied at the output terminal of receiver 150 is differentiated by a capacitor 156 and a resistor 158 that are connected in series between the ouput terminal of receiver 150 and circuit common. The signal developed across resistor 158 switches on an npn transistor 160, having its base electrode connected to the junction between capacitor 156 and resistor 158 and its emitter electrode connected to circuit potential, to conduct. Since the collector electrode of npn transistor 160 is connected to resistor 118 (via terminal 116), this causes pnp transistor 102 to turn on and thereby provide a reset pulse at terminal 110 with the duration of the reset pulse primarily being determined by the RC time constant of capacitor 156 and resistor 158 of failsafe reset circuit 106.

FIG. 3 illustrates a more detailed realization of the crash survivable memory unit circuitry contained within the environmental enclosure 60 of FIG. 1. The arrangement of FIG. 3 utilizes the previously mentioned type 80C51 controller manufactured by Intel Corporation of Santa Clara, Calif., with two of the available input/output (I/O) ports being connected for receiving the serial data signals supplied by data receiver 34 and data transmitter 38. A third I/O port of memory controller 32 in FIG. 3 is connected to terminal 90 of FIG. 1 for activating power regulator and switch unit 48 in the manner described relative to FIGS. 1 and 2. The operating voltage and memory reset signals, each of which is produced in the manner described relative to FIGS. 1 and 2, are respectively coupled to terminals of memory controller 32 that are identified as $V_{cc}$ and RST. The interrupt signal (developed at terminal 97 of FIG. 2 in the previously described manner) is connected to an input terminal of memory controller 32 that interrupts circuit operation whenever a logic level low is present (identified as terminal $\overline{INT}$ in FIG. 3). In addition, the interrupt signal is supplied to a disable terminal of address decoder 44 to disable operation of address decoder 44 whenever the interrupt signal is at logic level low to indicate that the operating voltage supplied by power supply 30 of signal acquisition unit 12 is below the level determined by zener diode of power down detector 94 (FIG. 2). Further, the interrupt signal is connected to a first input terminal of two 2-input NAND gates 162 and 164 that are located within the erase/write protection unit 58 of FIG. 3. The second input terminals of NAND gates 162 and 164 are respectively connected to the output terminals of NAND gates 166 and 168. The input terminals of NAND gate 166 are commonly connected to an output terminal of memory controller 32 that provides a logic level low signal ($\overline{RD}$) when memory controller 32 is sequenced to read flight data that is stored within memory unit 38 (i.e., when ground readout until 14 of FIG. 1 is utilized to extract data from crash survivable memory unit 10). In a similar manner, the two input terminals of NAND gate 168 are connected to a terminal ($\overline{WR}$) of memory controller 32, which supplies a logic level low signal whenever data is to be written into memory unit 38 of crash survivable memory unit 10. The output terminals of NAND gates 162 and 164 are connected to a control bus 170 that provides control signals to memory unit 38 with resistors 172 and 174 being connected between the circuit operating potential ($V_{cc}$) and the output terminals of NAND gates 162 and 164, respectively. In this arrangement, NAND gates 162 and 164 are of the open-collector variety and NAND gates 166 and 168 serve as inverter circuits. Thus, it can be recognized that whenever an interrupt signal (logic level low) is provided to NAND gates 162 and 164, the output terminals of NAND gates 162 and 164 are pulled-up to the potential then being supplied by power regulator and switch unit 48. Thus, whenever the output level of power supply 30 falls below the voltage established by zener diode 100 of power down detector 94, the resulting interrupt signal causes the potential at the output terminals of NAND gates 162 and 164 to substantially correspond to (track) the operating potential being supplied by power supply 30 of FIG. 1 (via power regulator and switch 48). Since, in the arrangement of FIG. 3, the memory read and write functions of memory unit 38 of FIG. 3 are enabled by signals at logic level low and since these signals are supplied by NAND gates 162 and 164, respectively (via control bus 170), data cannot be read from or written into memory unit 38 whenever the voltage supplied by power supply 30 of FIG. 1 is below the previously discussed predetermined level. On the other hand, whenever the voltage supplied by power supply 30 is above this predetermined level, the interrupt signal supplied to NAND gates 162 and 164 is at a logic level high and NAND gates 162 and 164 invert the signals supplied by NAND gates 166 and 168, respectively. Since NAND gates 166 and 168 act as inverters, signals substantially identical to the read and write enable signals produced by memory controller 32 will be generated by NAND gates 162 and 164 (respectively) and are coupled to memory unit 38 via control bus 170.

In addition to controlling the read and write enable lines, erase/write protection unit 58 of FIG. 3 includes an arrangement of logic gates that causes the mode selection control lines that interconnect memory controller 32 and memory unit 38 to be at the operating voltage supplied by power supply 30 (FIG. 1) if: (a) the voltage supplied by power supply 30 is less than the previously discussed predetermined level; or (b) improper operation of memory controller 32 during periods of abnormal operating voltage or other malfunctions cause memory controller 32 to supply unreliable control signals. In this regard, memory unit 38 of FIG. 3 is responsive to two control signals (CTL1 and CTL2) that are supplied by memory controller 32 to place memory unit 38 in an operating mode for the writing of data into memory, an operating mode for reading data out of memory and an erase mode. In the arrangement of FIG. 3, memory controller 32 not only supplies the CTL1 and CTL2 signals, but also supplies the complements (logical negation) of those signals, $\overline{CTL1}$ and $\overline{CTL2}$. The CTL1 and the $\overline{CTL1}$ signals are coupled to the first and second input terminals of an exclusive OR gate 176 having the output terminal thereof connected to one input terminal of a two input NAND gate 178. In a similar manner, the CTL2 and $\overline{CTL2}$ signals are coupled to the two input terminals of an exclusive OR gate 180 having the output terminal thereof connected to the second input terminal of two-input AND gate 178. With this arrangement, NAND gate 178 will supply a logic level low signal if, and only if, memory controller 32 supplies CTL1 and $\overline{CTL1}$ and supplies CTL2 and $\overline{CTL2}$ which are binary complements.

The signal provided by NAND gate 178 is connected to one input terminal of a NAND gate 182 having the second input terminal thereof connected to the output terminal of an exclusive OR gate 184. The first input terminal of exclusive OR gate 182 is connected for receiving the interrupt signal supplied by power down detector 94 of FIG. 2 whenever the operating voltage supplied by power supply 30 is below the previously determined limit. Since the second input terminal of exclusive OR gate 184 is connected to circuit common, NAND gate 182 supplies a signal at logic level zero if either the operating voltage supplied by power supply 30 is below the predetermined level or memory controller 32 is not supplying the proper complementary control signals. This signal is connected to one input terminal of two open collector, two-input NAND gates 186 and 188 and disables NAND gates 186 and 188 if either of the above-mentioned conditions exist. Since the output terminals of NAND gates 186 and 188 are connected to control bus 170 for supplying the two required control signals to memory unit 38 and are also connected to the circuit operating potential via resistors 190 and 192, respectively, the memory unit control signals will track the circuit operating voltage if that operating voltage is below the previously discussed predetermined level or if improper controls signals are provided by memory controller 32. On the other hand, since the $\overline{CTL1}$ and the $\overline{CTL2}$ control signals are respectively connected to the second input terminals of NAND gates 186 and 188, it can be recognized that signals equivalent to CTL1 and CTL2 are coupled to control bus 170 by NAND gates 186 and 188 whenever the circuit operating potential is above the predetermined level and memory controller 32 is properly supplying control signals that are complements of one another.

Memory unit 38 of FIG. 3 utilizes six EEPROMS that collectively form a, two-dimensional array of storage locations for storing the digitally encoded mishap data supplied by memory controller 32 via data bus 40 and for storing hereinafter-discussed data that is important to the practice of this invention. As is illustrated in FIG. 3, EEPROMS 194, 196, 198, 200, 202 and 204 each have the control terminals thereof connected for receiving the control signals supplied by NAND gates 162 and 164 and NAND gates 186 and 188. In a similar manner, each of the EEPROMS is connected for receiving the address signals supplied by memory controller 32 via address bus 42 and is interconnected with data bus 40 for the transfer of data between memory controller 32 and memory unit 38. As was discussed relative to the embodiment of FIG. 1, address decoder 44 decodes the two most significant bits and the least most significant bit of the address signal supplied by memory controller 32 to provide chip select signals that activate the particular EEPROM (194, 196, 198, 200, 202 or 204) being addressed by memory controller 32. In this regard, the embodiment of the invention depicted in FIGS. 2 and 3 operates so that odd valued addresses access memory locations within three of the six depicted EEPROMS, whereas memory addresses having even valued addresses, access memory locations within the remaining three EEPROMS. For convenience, the left-hand vertical column of EEPROMS in FIG. 3 (EEPROMS 194, 198 and 202) will be described as including the storage locations for even valued address signals and the right-hand column of EEPROMS (EEPROMS 196, 200 and 204) will be described as containing the storage locations for odd valued address signals. With the EEPROMS partitioned into two subsets that are respectively associated with even and odd valued address signals, it can be recognized that the least significant bit of the address signal supplied by memory controller 32 identifies the subset of EEPROMS to be accessed and the two most significant bits of the address signal identify which of the three EEPROMS within that subset is being accessed.

In the previously referenced, current realization of crash survivable memory unit 10, EEPROMS 194-204 are NCR 52864 64 kilobit EEPROMS, manufactured by NCR Corporation of Dayton, Ohio. These particular devices are configured for accessing 16 bytes of memory (with each byte of memory storing an 8-bit data word) with a single 16-bit address signal. Each EEPROM includes 16 address and data latches that allow 16 bytes of data (one "page") to be read into memory during each write cycle (of approximately 10 milliseconds) and allows an entire page of data to be erased during each erase cycle (approximately 100 milliseconds). Arrangement of this type of EEPROM in the manner depicted in FIG. 3 permits data to be simultaneously written into (or erased from), the memory locations associated with an even valued address signal and an odd valued address signal (e.g., one page of memory in EEPROMS 194, 198 or 202 and one page of memory in EEPROMS 196, 200 and 204). This organization permits data to be stored in memory unit 38 of FIG. 2 at rates exceeding 256 bytes per second.

In addition, memory unit 38 is organized and controlled by memory controller 32 to implement certain other features and aspects of this invention, including: (a) establishment of the previously mentioned, stored address directory that identifies faulty memory locations; (b) identification and protection of "special events," which are not overwritten with subsequent flight data when the available storage locations in memory unit 38 have all been utilized; (c) storage of flight data in a manner which identifies the time at which power interruptions occur; (d) the ongoing establishment of a boundary or marker between the oldest and newest stored flight data (which serves as a marker when the stored data is analyzed and when operation of the crash survivable memory unit resumes after being interrupted); and (e) storage of an identification code in each of the EEPROMS of memory unit 38 to allow identification of the EEPROMS if they are dislodged during an aircraft crash and also to permit detection of a "stuck" address line (i.e., a circuit failure that causes one or more address lines to remain at a fixed potential regardless of the applied address signal).

Figure 4:
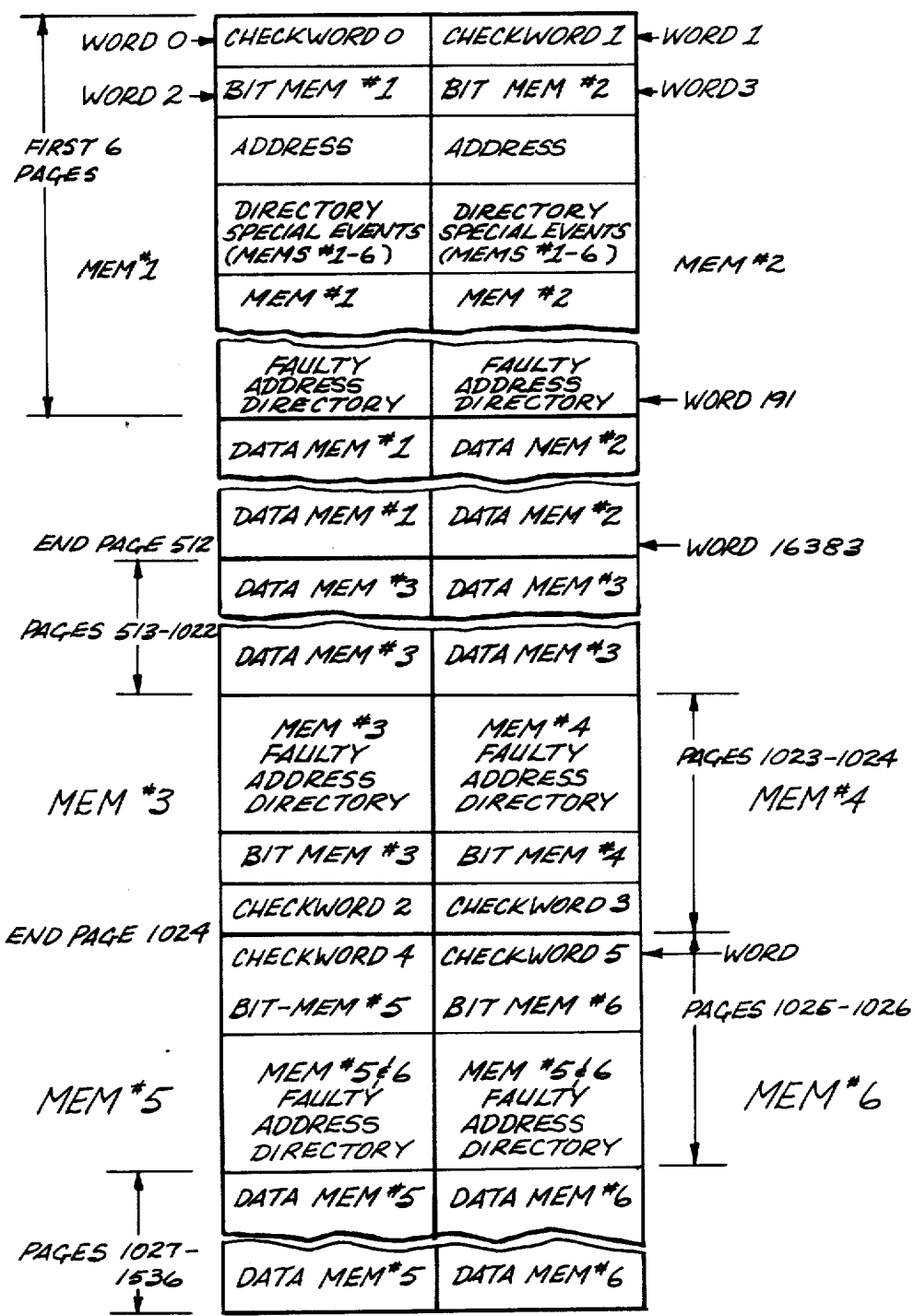
FIG. 4 diagrammatically depicts the memory space allocations associated with a crash survivable memory unit configured in accordance with this invention.

The manner in which the crash survivable memory unit of this invention provides the above-mentioned features can be understood with reference to FIG. 4, which illustrates the memory organization in the embodiment of the invention that is employed with the previously mentioned, current realization of the flight data recorder system of FIG. 1. In FIG. 4, the memory space of Memory Nos. 1-6 (memories 194, 196, 198, 200, 202 and 204 in FIG. 3) are depicted in the same relationship as was utilized relative to FIG. 3. That is, the memory locations within Memory Nos. 1, 3 and 5 (memories 194, 198 and 202 of FIG. 3) collectively form a column of memory locations, each of which is accessed by an even valued address signal. The memory locations of Memory Nos. 2, 4 and 6 (memories 196, 200 and 204 of FIG. 3) collectively form a second (right-hand) column of memory locations in FIG. 4, with these memory locations being accessed by even valued address signals. Thus, consecutive address signals that increase in value alternately access memory locations in the left- and right-hand columns of the memory space depicted in FIG. 4 with sequential addressing proceeding from the top to bottom of the memory space.

As is also indicated in FIG. 4, the memory space of memory unit 38 is divided into pages, with each page consisting of memory locations within the left-hand and right-hand columns of the depicted memory space. In this regard, in the current embodiment of the invention wherein each of the six memories (194-204 in FIG. 3)

access 16 bytes of memory space with each address signal, the invention employs a 32-byte (word) page consisting of 16 bytes of memory in the left-hand column of memory space and the nextmost addressed 32-bytes of memory in the right-hand column of the address space of FIG. 4. For example, the first page of memory consists of the first 16 bytes of memory space within Memory No. 1 and the first 16 bytes of memory space within Memory No. 2, with the first stored word being located in the first byte of memory space in Memory No. 1, the second stored word being located in the first byte of memory space in Memory No. 2, the third stored word being located in the second byte of memory in Memory No. 1, etc. With this arrangement, the 64-kilobit EEPROMS utilized in the referenced embodiment of the invention result in the first 512 pages of memory being formed by Memory Nos. 1 and 2 (194 and 196 in FIG. 3); pages 512-1024 being formed by Memory Nos. 3 and 4 (198 and 200 in FIG. 3); and pages 1025-1536 being formed by Memory Nos. 5 and 6 (202 and 204 in FIG. 3).

As is indicated in FIG. 4, the memory space of memory unit 38 (the six EEPROMS) is partitioned to provide memory space for the storage of recorded flight data and memory space that is dedicated to the storage of data which is necessary for the practice of the invention. In this regard, in the memory space allocation depicted in FIG. 4, the first six pages of memory space that are defined by Memory Nos. 1 and 2 are reserved or dedicated, while the remaining 506 pages of memory space are available for storing flight recorded data. In a similar manner, the first 510 pages of memory space defined by Memory Nos. 3 and 4 are available for storage of recorded flight data, whereas the last two pages thereof are reserved memory locations. With respect to the memory space formed by Memory Nos. 5 and 6, the first two pages of memory space are dedicated for storage of various data that is used in the practice of the invention and the remaining 510 pages (pages 1027-1536) are available for the storage of recorded flight data. As can be seen in FIG. 4, partitioning the memory space in the above-described manner in effect forms two blocks of memory space for storage of flight data (i.e., pages 7-1022, defined by Memory Nos. 1, 2, 3 and 4 and pages 1027-1536, which are defined by Memory Nos. 5 and 6).

The above-described dedicated portions of the memory space of FIG. 4 are utilized for storing: (a) "checkword" that uniquely identifies each of the six memory circuits; (b) "built-in test words," which are utilized by memory controller 32 in determining the operational status of each memory circuit; (c) the previously mentioned "directory of special events," which provides the beginning and ending address for a block of recorded flight data that is to be maintained within memory unit 38 until it is extracted by the ground readout unit (14 in FIG. 1); and (d) a directory of the faulty address locations within memory unit 38 that are detected during operation of the invention. Checkwords for Memory Nos. 1 and 2 are stored in the first two bytes of the first page of memory; the checkwords for Memory Nos. 3 and 4 are stored in the last two bytes of memory defined by Memory Nos. 3 and 4 (i.e., the last two bytes of memory in page 1024); and the checkwords for Memory Nos. 5 and 6 are stored in the first two bytes of the memory space defined by Memory Nos. 5 and 6 (i.e., the first two bytes of page 1025).

The checkwords which will identify the respective memories are stored at the above-indicated locations during fabrication and testing of the crash survivable memory unit of this invention to permit the previously mentioned memory circuit identification if the memory circuits are dislodged during an aircraft crash. Further, organizing the memory space of memory unit 38 to store the check words in the above-indicated manner is advantageous in that the memory space for storing recorded flight data is defined as two (rather than three) blocks of memory locations. Further, since the checkwords for Memory Nos. 1, 2, 5 and 6 are stored at the first memory location within those memories (address signal all zeros) and the checkwords for Memory Nos. 3 and 4 are stored in the last memory locations of those memories (address signal all ones), the indicated memory allocation facilitates checking the address lines between memory controller 32 and memory unit 38. In particular, as the checkwords are accessed during operation of the invention, memory controller 32 can readily determine stuck address lines as it accesses and reads the checkwords for Memory Nos. 1-6 of FIG. 4.

In the current realization of the invention, during final assembly and testing, digitally encoded information that indicates proper operation of crash survivable memory unit 10 is written into the memory locations of memory unit 38 that are dedicated to built-in testing (i.e., the second memory bytes in Memory Nos. 1, 2, 5 and 6; and the penultimate memory bytes in Memory Nos. 3 and 4). During operation of the invention, memory controller 32 periodically checks the data words stored at these locations (e.g. performs a checksum) to verify the operational status of crash survivable unit 10.

As is shown in FIG. 4, in the embodiment of the invention being described, the directory of special events for the entire memory space (Memory Nos. 1-6) is defined within a portion of the dedicated memory space of Memory Nos. 1 and 2. As shall be described in more detail in describing the operation of the invention, when CPU 24 of signal acquisition unit 12 (FIG. 1) supplies memory controller 32 of crash survivable memory unit 10 with a digitally encoded message indicating that a portion of the data being recorded is to be preserved until unloaded by ground readout unit 14 of FIG. 1, memory controller 32 addresses the next available two bytes of memory within the space dedicated for the directory of special events and stores a beginning and ending address which identifies the flight data within memory unit 38 that is to be preserved. During periods in which memory controller 32 is accessing memory unit 38 to store additional flight data, each time memory controller 32 reaches an address corresponding to the start of a new page of memory that is allocated for storage of flight data, the memory controller searches the special events directory. If the next page of flight data memory is to be preserved (i.e., the page address is stored in the special events directory), memory controller 32 advances to the beginning of the first page of flight data memory that does not include flight data that is to be preserved.

Referring still to FIG. 4, the faulty address directories that are defined in the dedicated memory space of Memory Nos. 1-6 (memories 194, 196, 198, 200, 202 and 204 in FIG. 3) are utilized for storing addresses of the respective memory circuits which are detected as not properly storing data during the sequencing of memory controller 32. In this regard, and as shall be described in more detail relative to the operation of this invention, each time memory controller 32 operates to load data into the EEPROMS, the memory controller reads the data that has been loaded and compares it with the data that was transmitted to memory unit 38. If the loaded data does not correspond with the data transmitted to memory unit 38, memory controller 32 loads the address of the memory location being accessed into the next available byte location in the faulty address directory of the memory circuit being accessed. For example, in the previously mentioned current realization of the type of flight data recorder system depicted in FIG. 1, the data word stored in the addressed location of memory unit 38 is compared with the data word which was transmitted to memory unit 38 from storage locations within the previously mentioned two 32-byte buffer memories of memory controller 32. If a data error is detected, memory controller 32 sequences to store the address contained in address latch 46 in the faulty address directory of the memory unit 38. By searching this directory when data is being stored in memory unit 38, memory controller 32 is sequenced to skip failed storage locations within memory unit 38. This aids in ensuring that the flight data stored in crash survivable memory unit 10 is accurate and, accordingly, enhances the accuracy and reliability of the analysis process that is performed on data stored within memory unit 38 when attempting to determine the cause of aircraft mishap or crash. In addition, since failure of memory locations within conventional EEPROMS occurs gradually, the data comparison technique utilized in the practice of the invention extends the effective lifetime of the EEPROMS that make up memory unit 38 and thereby decreases maintenance requirements for crash survivable memory unit 10.

Figure 5:
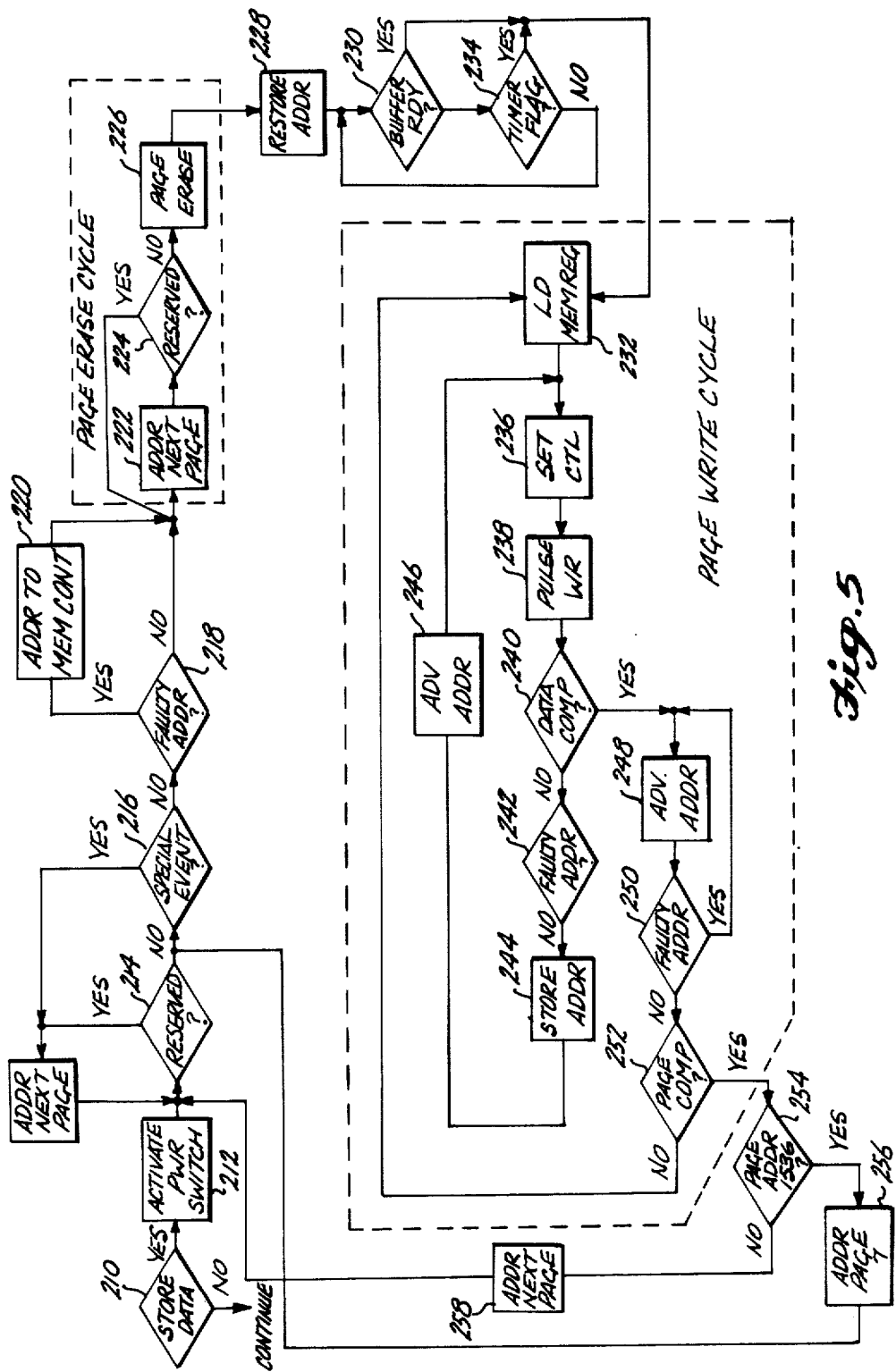
FIG. 5 is a flow diagram that illustrates the manner in which an embodiment of the invention can be sequenced to store digitally encoded flight data.
Figure 6:
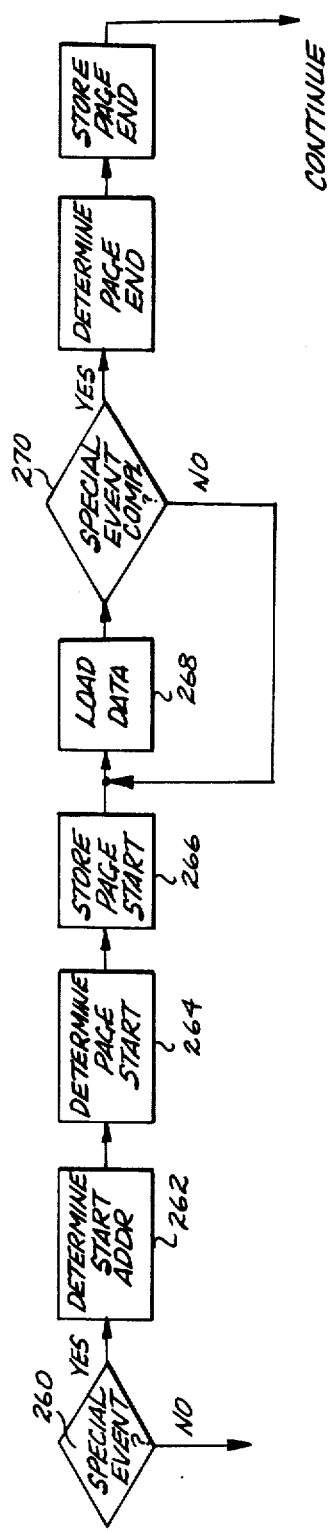
FIG. 6 is a flow diagram that illustrates the manner in which an embodiment of the invention can be sequenced to store beginning and ending addresses in the special event directory.
Figure 7:
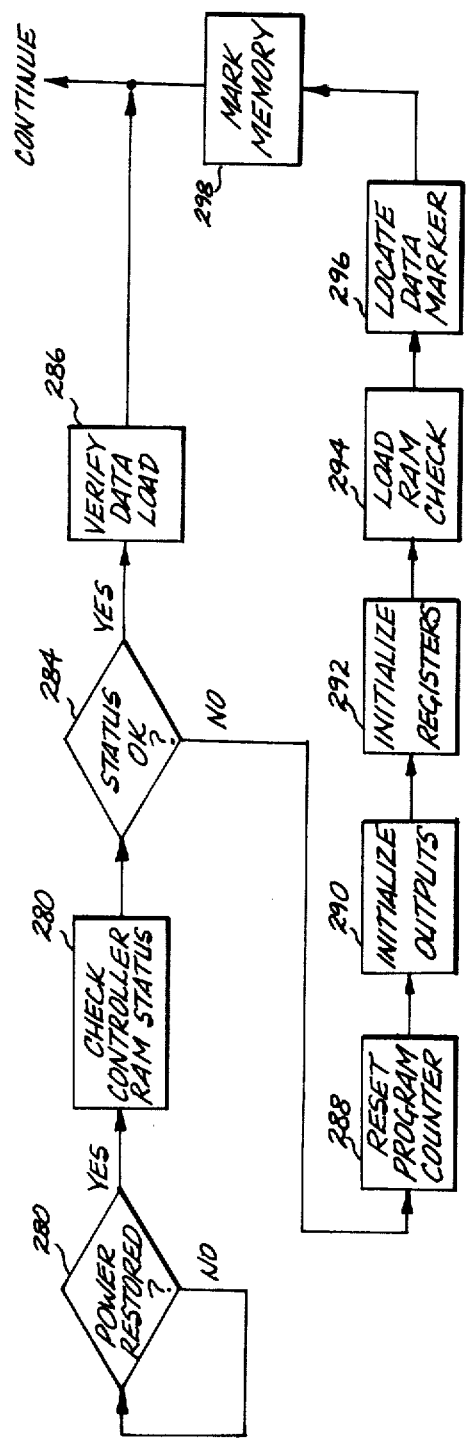
FIG. 7 is a flow diagram that illustrates the manner in which an embodiment of the invention can be sequenced to resume operation after a power interruption of long or short duration.

The operation of a crash survivable memory unit configured in accordance with this invention can be more completely understood by considering the structure and memory organization described relative to FIGS. 1 through 4 in conjunction with the system flow diagrams depicted in FIGS. 5 through 7.

In viewing FIG. 5, it should be recalled that CPU 24 of signal acquisition unit 12 provides digitally encoded command messages to memory controller 32 of crash survivable memory unit 10 via receiver 34 (FIGS. 1 and 3). As is indicated by the decisional block 210 in FIG. 5, when CPU 24 supplies a command message to cause crash survivable memory unit 10 to store flight data in memory unit 38, memory controller 32 activates power regulator and switch unit 48 (indicated by block 212 in FIG. 5). Activation of power regulator and switch unit 48 by means of the previously discussed switch control signal supplies operating power all the circuitry within environmental enclosure 60, except memory controller 32.

When sufficient time is allowed for the circuits to settle, memory controller 32 tests the current memory address signal to determine whether it corresponds to a reserved page of memory space within memory unit 38. This operation is indicated by decisional block 214 of FIG. 5. If the addressed page of memory space is not reserved, memory controller 32 searches the special event directory described relative to FIG. 4 to determine whether the address corresponds to a page of memory space that stores data for a special event. If decisional block 216 of FIG. 5 results in a determination that memory controller 32 is attempting to access a page of memory space that includes special event data, or if decisional block 214 results in a determination that a page of memory space being accessed is a portion of the previously discussed reserved memory space, the address signal supplied by memory controller 32 is advanced to the address for the next page of memory (indicated at block 215 of FIG. 5). The newly formulated address then is tested at decisional blocks 214 and 216 to determine whether the page memory space corresponding to that address is available for storage of flight data.

As is indicated by decisional block 218, when memory controller 32 provides an address signal that corresponds with an available page of memory space, memory controller 32 searches the faulty address directory of the memory circuits being accessed. If the faulty address directory contains one or more addresses within the page of memory space to be accessed, memory controller 32 transfers those addresses to its random access memory for subsequent use in determining which memory locations are available during the write cycle of memory unit 38. This operation is indicated by blocks 218 and 220 of FIG. 5.

Having determined the address of the next available page for storing flight data and having determined which addresses within that portion of memory are faulty, the system sequences to erase the oldest stored flight data so that new data can be written into memory unit 38 in a manner that maintains at least one fully erased page of memory space between newly recorded flight data and the oldest stored flight data. This is accomplished by erasing a single page of memory space each time data is to be written into memory, with the page that is erased being the page that will be written into during the next most memory-write cycle. Thus, when an erase sequence is complete, two erased pages of memory space separate the oldest and newest recorded flight data and at least one full page of erased memory space will separate the oldest and newest recorded data when the hereinafter described page write cycle is complete. Maintaining such an erased boundary within the memory space of memory unit 38 provides a marker that is used to identify the beginning (and end) of the flight data record when crash survivable memory unit 10 is powered-up or activated after a power interruption and when data is retrieved from crash survivable memory unit by ground read out unit 14.

In the flow diagram of FIG. 5, the sequence for erasing the page of memory space that will be written into during the next page write cycle (i.e., to provide two erased pages of memory space) consists of advancing the address signal supplied by memory controller 32 to an address that corresponds with the next available page of memory in memory unit 38 (block 222 in FIG. 5). The new page address is then tested at decisional block 224 to determine whether the corresponding page of memory space is reserved. If the new address corresponds to a reserved page of memory space, the address is again advanced at block 222 of FIG. 5 and retested at decisional block 224. Once the address of the next available page of memory space is determined, memory controller 32 sequences to erase the flight data previously recorded in the corresponding memory locations. This operation, indicated at block 226 of FIG. 5, includes supplying the associated address signal to memory unit 38, setting the control lines (CTL1, CTL2, $\overline{\text{CTL1}}$ and $\overline{\text{CTL2}}$ to correspond with the two bit signal (and its complement) that enables the erase circuits of memory unit 38. When the erase cycle is complete, memory controller 32 restores the address signal that was provided prior to the time at which the erase cycle began (indicated by block 228 in FIG. 5).

Next, memory controller 32 determines whether flight data is available for loading into the accessed page of memory space. In the realization of the flight data recorder system of FIG. 1 that is being discussed, flight data is loaded into memory unit 38 if the previously mentioned 32-byte buffer memory within CPU 24 of signal acquisition unit 12 contains at least 16 bytes of data (half-filled) or alternatively, if 16 bytes of data are not made available within a predetermined time interval. In this regard, in the sequence represented by FIG. 5, memory unit 32 tests a flag that is set by CPU 24 when at least 16 bytes of data are available in the buffer memory (at decisional block 230). If the flag is present, memory controller 32 advances to block 232 of FIG. 5 to begin the page write cycle, which loads data into memory unit 38. If the buffer flag is not present, a timer flag is tested by memory controller 32 at decisional block 234, FIG. 5. The timer flag, which is set by an internal clock (counter) of memory controller 32 and which is reset each time memory controller 32 accesses a new page of memory space, provides a flag signal if memory controller 32 operates in the data store mode for a predetermined time without accessing a new page of memory space. In the arrangement of FIG. 5, if the timer flag is present, memory controller 32 advances to block 232 to begin the page write cycle. On the other hand, if the timer flag is not present (i.e., the required period of time has not elapsed), memory controller 32 again tests the buffer ready flag (at decisional block 232) and the timer flag (at decisional block 234) until either the buffer memory is filled to the level at which the buffer flag is set or the required period of time elapses.

As is indicated at block 232 of FIG. 5, the page write cycle begins with the transfer of flight data from the 32-byte buffer memory of memory controller 32 to the two 16-byte registers of the two memory circuits that are associated with the page of memory space being addressed (one 16-byte address and one 16-byte data register being located on each of the two EEPROMS that define that page of memory space). When the memory registers are loaded, memory unit 32 sets the control lines (CTL1, CTL2, $\overline{CTL1}$ and $\overline{CTL2}$) to provide a two bit control signal (and its complement) that enables the write circuits of the selected EEPROMS via erase-/write protection circuit 58 of FIGS. 1 and 3. When the write circuits are enabled (indicated at block 236 of FIG. 5), memory controller 32 supplies a write enable pulse ($\overline{WR}$) to memory unit 38 via erase/write protection circuit 58. This causes the first byte of flight data in each of the registers of the two selected EEPROMS to be loaded into the EEPROMS as the first and second bytes of memory space within the access page of memory space. Thus, two bytes of flight data are loaded with each pass through the page write cycle of FIG. 5.

As is indicated by decisional block 240, memory controller 32 then sequences to compare the data stored in memory unit 38 with the corresponding data within the intermediate buffer memory of memory controller 32. If the stored data is not equivalent to the data within the buffer memory, and if the address of that byte of memory space is not already contained in the associated faulty address directory (determined at decisional block 242), the address of the memory location being accessed is stored in the associated faulty address directory (block 244, FIG. 5). The address signal supplied by memory controller 32 is then advanced to the next flight data storage location (at block 246) and the data write cycle is repeated with the same flight data. When the data stored in memory unit 38 corresponds with the data provided by the memory controller intermediate buffer memory (indicated by the "yes" branch of decisional block 240), the address signal is advanced to access the next two bytes of memory space (at block 248) and memory controller 32 determines whether that address signal corresponds with an address transferred to the random access memory of controller 32 during the portion of the sequence previously discussed relative to block 220 of FIG. 5. As is indicated by decisional block 250, if the new address corresponds to a faulty memory address, memory controller 32 continues to advance the address signal until the next most fully functional byte of memory space is located. As is indicated by decisional block 250 of FIG. 5, memory controller 32 then checks the new address to determine whether execution of the page write cycle has filled the page of memory space being written into (decisional block 252 in FIG. 5). If the page write cycle has not sequenced the number of times required to fill the page of memory space, memory controller 32 selects the next byte of flight data from each of the two memory registers and again executes the above-described write cycle. If the page of memory space has been filled, the memory address signal is examined at decisional block 254 to determine whether the page of memory space filled during the just executed page write cycle corresponds to the last page of memory space (i.e., page 1536 in the memory space depicted in FIG. 4). If this is the case, memory controller 32 establishes the address signal so that page 7 of the memory space of FIG. 4 will be accessed (the first non-reserved page of memory space in FIG. 4) and sequences to record data in page 7 of memory space by again executing the step indicated at decisional block 216 of FIG. 5 to determine whether the addressed page of memory space stores protected, special event flight data. If it is determined that the page of memory space filled by the page write cycle is not the last available page of memory space for recording flight data (not page 1536 in FIG. 4), the address signal is set for accessing the next page of memory space (block 258 in FIG. 5). Memory controller 32 then begins storage of the next page of flight data by sequencing to decisional block 214 of FIG. 5 to determine whether the new page address corresponds to a page of memory space that is available for recording flight data.

As previously mentioned, in the flight data recorder system of FIG. 1, CPU 24 of signal acquisition unit 12 supplies an encoded command message to crash survivable memory unit 10 whenever flight data corresponding to a predetermined period of time is to be maintained in memory unit 38 as a protected, special event. In a flight data recorder system of the type illustrated in FIG. 1, CPU 24 can be configured and sequenced to supply such a command message in response to numerous input signals, including a signal that is provided by a switch that is activated by a crew member whenever irregularities in aircraft performance exist and/or a signal that is automatically generated by one or more aircraft systems. For example, a signal can be provided to CPU unit 24 whenever a monitored aircraft performance or status parameter such as engine gas temperature or rate of descent exceeds a selected value.

Regardless of the manner in which CPU unit 24 signal acquisition unit 12 is activated to supply a command message to crash survivable memory unit 10, CPU 24 and memory controller 32 of crash survivable memory unit 10 are collectively configured and sequenced to determine the beginning and end address of the memory space within memory unit 38 that contains flight data associated with that particular special event. For example, in the previously referenced current realization of the flight data recorder system of FIG. 1, CPU 24 and memory controller 32 operate so that 30 seconds of recorded flight data are preserved each time CPU 24 supplies a special event message to crash survivable memory unit 10. This operation is illustrated by the flow diagram of FIG. 6 which can be used in a flight data recorder system configuration wherein CPU 24 simply provides a command signal that identifies the time at which one of the aircraft systems or a crew member requests storage of special event flight data. As is indicated by block 260 and 262 of FIG. 6, in such an arrangement, memory controller 32 sequences to determine the starting address of the flight data to be protected whenever CPU 24 provides the appropriate command message. To determine the starting address for the special event, memory controller 32 searches the data stored in the memory space of memory unit 38 to locate the stored byte of flight data that corresponds to the desired starting time of the special event. In this regard, memory unit 32 generally operates to locate a byte of stored flight data that corresponds with a point in time that preceded the time at which the command message was supplied to crash survivable unit 10. For example, it may be desirable to sequence memory controller 32 so that each recorded special event consists of flight data corresponding to equal intervals of time that precede and follow the time at which a command message is generated by CPU 24.

As is indicated by block 264 of FIG. 6, once the address of the memory location that stores the first byte of flight data of the special event is determined, memory controller 32 operates to determine the address of the page of memory space containing that byte of flight data. This procedure is utilized to allow the page writing and erasing procedure previously discussed herein. As is indicated by block 266 of FIG. 6, once the address of the first page of stored flight data of the special event is determined, the address is stored in the next most available byte of the memory space that is reserved as the special events directory. As is indicated by block 268 of FIG. 5, at this point, memory controller 32 loads flight data into memory unit 38 in the manner described relative to FIG. 5. As flight data is loaded into memory, memory controller 32 sequences to determine whether the byte of flight data being loaded corresponds to the end of the special event of interest (indicated by decisional block 270 of FIG. 6). When the last byte of flight data for the special event is loaded into memory 38, memory controller 32 sequences to determine the address of the end of the page of memory space that stores the final byte of special event flight data (block 272) and stores that address in the special events directory of memory space (block 274). Memory controller 32 then continues its normal sequence for loading flight data and self test until it receives another special event command message. As previously mentioned and described relative to FIG. 5, the flight data corresponding to the recorded special event is preserved until that data is transferred to ground read out unit 14 of FIG. 1, at which time both the flight data and the corresponding beginning and ending address that is stored in the special events directory are erased.

FIG. 7 illustrates a sequence that utilizes the previously discussed signal supplied by power down detector 94 to reactivate crash survivable memory unit 10 following a power interruption of substantial duration (e.g., normal activation of the flight data recorder system after it has been turned off) or after a power interruption of short duration that results from unintended fluctuations in the operating potential provided by power supply 30 of FIG. 1. In the flow diagram of FIG. 7, memory controller 31 checks the status of its random access memory whenever the memory controller determines that operating power has been restored to crash survivable memory unit 10 (indicated by blocks 280 and 282 of FIG. 7). In this regard, memory controller 31 can be provided with a signal by CPU 24 of signal acquisition unit 12 each time power is restored to the system or, alternatively, memory unit 31 can periodically monitor the status of the signal supplied by power down detector 94 (FIG. 2) to detect a signal transistion indicating that power has been restored. In either case, upon detecting the restoration of operating power, memory unit 31 then searches a dedicated portion of the random access memory contained in memory controller 31 to determine whether that portion of memory contains a predetermined binary coded pattern. In this regard, as shall be described, each time the sequence of FIG. 7 is performed following a power interruption of long duration ("cold power up"), a checkerboard pattern of ones and zeros is stored within the dedicated portion of the random access memory contained in memory controller 31. If the checkerboard pattern is present after a power interruption (determined at decisional block 284 of FIG. 7), the power interruption was of short duration ("warm power up") and memory controller 31 continues its operational sequence after first verifying that the data stored in the previously discussed intermediate buffer memory has been properly loaded into memory unit 38 (determined at block 286 of FIG. 7). On the other hand, if the checkerboard pattern is not fully present in the memory controller random access memory, memory controller 31 is sequenced through the cold power up procedure which consists of: resetting the memory controller counter to zero (block 288); initializing the output ports of crash survivable memory unit 10 (block 290); initializing the various memory registers of memory controller 31 and memory unit 38 (block 292); and loading the previously mentioned checkerboard pattern into the random access memory of controller 31. As is indicated at block 296 of FIG. 7, memory controller 31 is then sequenced to determine the memory address of the flight data that was stored in memory 38 immediately prior to the power interruption. To accomplish this, memory controller 31 sequentially accesses the first four bytes (words) of each page of flight data that is stored in memory unit 38. When a page is located wherein the first four words consists of binary zeros, memory controller 31 examines the information stored within the remaining portion of that page. If binary zeros are stored at each memory location, the page of data corresponds to the erased pages of memory space that are established during the data loading sequence of FIG. 5 and serve as a marker between the most recently recorded page of flight data and the oldest recorded flight data.

Although memory controller 31 could continue its normal sequence from the located address, and thereby store flight data in the proper time sequence, memory controller 31 preferably is sequenced to provide a record of the power interruption. This operation is indicated by block 298 of FIG. 7 and, in the current embodiment of crash survivable memory unit 10 consists of advancing the memory controller address pointer to leave a four byte erased gap (all binary zeros) between the flight data stored prior to the power interruption and any flight data that is loaded into memory unit 38 after power is restored. This provides a marker that will be retained until overwritten with new flight data. Such a marker can provide important information, for example, relative to power interruptions that occur immediately before an aircraft crash or if the period of time at which the power interruption occurs be preserved as a special event.

It should be recognized by those skilled in the art that the foregoing description is exemplary in nature and that various changes and modifications can be made without departing from the scope and spirit of the invention. For example, although the invention has been disclosed relative to a memory unit 38 that is organized to utilize write, read and erase cycles that operate on a multiple byte or page-by-page basis, memory circuits of the type that function on a byte-by-byte basis can be utilized by suitably sequencing memory controller 32 (i.e., by providing suitable stored instructions in the read-only memory that programs the memory controller). In addition, it will be apparent to those skilled in the art that various other circuit arrangements can be used for the circuits discussed herein, including those arrangements utilized for power and regulator switch 48, power monitor 52 and erase/write protection circuit 58.

The embodiments of the invention in which an exclusive property or privilege is claimed are defined as follows:

1. A solid state memory for storing digitally encoded flight data comprising:
   memory means having a power input terminal for applying an operating potential to said memory means and having a plurality of storage locations that are selectively accessed by supplying a digitally encoded address signal to said memory means, said memory means being responsive to a control signal for storing supplied digitally encoded data at storage locations corresponding to said address signal supplied to said memory means when said operating potential is supplied to said power input terminal and said control signal is supplied to said memory means;
   switch means having an input terminal, an output terminal and a control terminal, said output terminal of said switch means being coupled to said power input terminal of said memory means, said switch means being responsive to a switch control signal for coupling an electrical potential supplied to said input terminal of said switch means to said switch means output terminal only when said switch control signal is supplied to said control terminal of said switch means; and
   memory controller means for supplying said switch control signal to said switch means and for supplying said address signals and said control signal to said memory means, said memory controller means including means for executing an operational sequence wherein said address and control signals are periodically supplied to said memory means and wherein said switch control signal is supplied to said switch means only during periods of time in which said address and control signal is supplied to said memory means.

2. The solid state memory of claim 1 wherein said memory means and said memory controller means are contained within an environmental housing to thermally insulate said memory means and said memory controller means from the surrounding environment, and wherein said switch means is located outside said environmental housing.

3. The solid state memory of claim 1 wherein said memory controller means further includes means responsive to an applied interrupt signal for interrupting said operational sequence of said memory controller means, said solid state memory comprising power monitor means for monitoring an applied signal representative of the operating potential supplied to said input terminal of said switch means, said power monitor means including means for supplying said interrupt signal to said memory controller means when the level of said applied signal is less than a predetermined value.

4. The solid state memory of claim 3 wherein said memory means and said memory controller means are contained within an environmental housing to thermally insulate said memory means and said memory controller means from the surrounding environment, and wherein said switch means and said power monitor means are located outside said environmental housing.

5. The solid state memory of claim 3 wherein said memory means includes means responsive to said control signal for enabling digital data transfer between said memory controller means and said selectively accessed storage locations when the magnitude of said control signal is within a predetermined range and for disabling digital data transfer between said memory controller means and said selectively accessed storage locations when said magnitude of said control signal is outside said predetermined range, said solid state memory further comprising memory protection means connected for receiving said interrupt signal supplied by said power monitor means, said memory protection means including means for supplying said control signal to said memory means at a magnitude within said predetermined range when said interrupt signal is not supplied to said memory protection means and means for supplying said control signal to said memory controller means at a magnitude that is outside said predetermined range when said interrupt signal is supplied to said memory protection means.

6. The solid state memory of claim 5 wherein said memory means, said memory protection means and said memory controller means are contained within an environmental housing to thermally insulate said memory means, said memory protection means and said memory controller means from the surrounding environment, and wherein means from the surrounding environment, and wherein said switch means and said power monitor means are located outside said environmental housing.

7. The solid state memory of claim 5 wherein said digitally encoded flight data are a sequence of digitally encoded data signals and wherein:
   (a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
(d) said memory controller means further includes means for supplying said second control signal only for storage location addresses having a decimal equivalent value that is outside the range of consecutive integers that is defined by the decimal equivalent values of said first and second address for each of said address pairs.

8. The solid state memory of claim 7 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

9. The solid state memory of claim 5 wherein:
(a) said digitally encoded flight data are a sequence of signals with each data signal of said sequence having a maximum bit length;
(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;
(c) said memory controller means further includes means for supplying a second control signal for erasing data stored at storage locations corresponding to said address signals supplied to said memory means;
(d) said memory controller means further includes means for storing each digitally encoded data signal of said sequence of signals in a set of storage locations of said memory means at least equal in bit length to said predetermined maximum bit length; and
(e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

10. The solid state memory of claim 3 wherein said memory controller means is responsive to a reset signal for initializing said operational sequence of said memory controller means and said power monitor means further comprises means responsive to said electrical potential supplied at said output terminal of said switch means for supplying said reset signal to said memory controller means when said operating potential for said memory means is not present at said output terminal of said switch means for a predetermined period of time.

11. The solid state memory of claim 10 wherein said memory means and said memory controller means are contained within an environmental housing to thermally insulate said memory means and said memory controller means from the surrounding environment, and wherein said switch means and said power monitor means are located outside said environmental housing.

12. The solid state memory of claim 10 wherein said power monitor means further comprises means responsive to said opeerating potential supplied to said input terminal of said switch means for supplying a reset signal to said memory controller means each time operating potential is supplied to said input terminal of said switch means.

13. The solid state memory of claim 12 wherein said memory means and said memory controller means are contained within an environmental housing to thermally insulate said memory means and said memory controller means from the surrounding environment, and wherein said switch means and said power monitor means are located outside said environmental housing.

14. The solid state memory of claim 12 wherein said digitally encoded flight data are a sequence of digitally encoded data signals and wherein:
(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and (d) said memory controller means further includes means for supplying said second control signal only for storage location addresses having a decimal equivalent value that is outside the range of consecutive integers that is defined by the decimal equivalent values of said first and second address for each of said address pairs.

15. The solid state memory of claim 14 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

16. The solid state memory of claim 10 wherein said memory means includes means responsive to said control signal for enabling digital data transfer between said memory controller means and said selectively accessed storage locations when the magnitude of said control signal is within a predetermined range and for disabling digital data transfer between said memory controller means and said selectively accessed storage locations when said magnitude of said control signal is outside said predetermined range, said solid state memory further comprising memory protection means connected for receiving said interrupt signal supplied by said power monitor means, said memory protection means including means for supplying said control signal to said memory means at a magnitude within said predetermined range when said interrupt signal is not supplied to said memory protection means and means for supplying said control signal to said memory controller means at a magnitude that it outside said predetermined range when said interrupt signal is supplied to said memory protection means.

17. The solid state memory of claim 16 wherein said memory means, said memory protection means, said means for temporarily storing said digitally encoded data and said memory controller means are contained within an environmental housing to thermally insulate said memory means and said memory controller means from the surrounding environment, and wherein said switch means is located outside said environmental housing.

18. The solid state memory of claim 16 wherein said digitally encoded flight data are a sequence of digitally encoded data signals and wherein:
(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
(d) said memory controller means further includes means for supplying said second control signal only for storage location addresses having a decimal equivalent value that is outside the range of consecutive integers that is defined by the decimal equivalent values of said first and second address for each of said address pairs.

19. The solid state memory of claim 18 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

20. The solid state memory of claim 16 wherein:
(a) said digitally encoded flight data are a sequence of signals with each data signal of said sequence having a maximum bit length;
(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;
(c) said memory controller means further includes means for supplying a second control signal for erasing data stored at storage locations corresponding to said address signals supplied to said memory means;
(d) said memory controller means further includes means for storing each digitally encoded data signal of said sequence of signals in a set of storage locations of said memory means at least equal in bit length to said predetermined maximum bit length; and
(e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

21. The solid state memory of claim 10 wherein said digitally encoded flight data are a sequence of digitally encoded data signals and wherein:

(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;

(b) said memory controller means further includes means for supplying a second control signal for erasing data stored at storage locations corresponding to address signals supplied to said memory means;

(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and (d) said memory controller means further includes means for supplying said second control signal only for storage location addresses having a decimal equivalent value that is outside the range of consecutive integers that is defined by the decimal equivalent values of said first and second address for each of said address pairs.

22. The solid state memory of claim 21 wherein:

(a) each said digitally encoded data signal of said sequence of signals exhibits a predetermined maximum bit length;

(b) said memory controller means includes means for storing each digitally encoded signal of said sequence of signals in a set of storage locations of said memory means at least equal in bit length to said predetermined maximum bit length; and (c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

23. The solid state memory of claim 10 wherein:

(a) said digitally encoded flight data are a sequence of signals with each data signal of said sequence having a maximum bit length;

(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;

(c) said memory controller means further includes means for supplying a second control signal for erasing data stored at storage locations corresponding to said address signals supplied to said memory means;

(d) said memory controller means further includes means for storing each digitally encoded data signal of said sequence of signals in a set of storage locations of said memory means at least equal in bit length to said predetermined maximum bit length; and (e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

24. The solid state memory of claim 3 wherein said memory controller means is responsive to a reset signal for initializing said operational sequence of said memory controller means and said power monitor means further comprises means responsive to said operating potential supplied to said input terminal of said switch means for supplying a reset signal to said memory controller means each time said operating potential is supplied to said input terminal of said switch means.

25. The solid state memory of claim 24 wherein said memory means and said memory controller means are contained within an environmental housing to thermally insulate said memory means and said memory controller means from the surrounding environment, and wherein said switch means and said power monitor means are located outside said environmental housing.

26. The solid state memory of claim 24 wherein said digitally encoded flight data are a sequence of digitally encoded data signals and wherein:

(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;

(b) said memory controller means further includes means for supplying a second control signal for erasing data stored at storage locations corresponding to address signals supplied to said memory means;

(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and (d) said memory controller means further includes means for supplying said second control signal only for storage location addresses having a decimal equivalent value that is outside the range of consecutive integers that is defined by the decimal equivalent values of said first and second address for each of said address pairs.

27. The solid state memory of claim 26 wherein:

(a) each said digitally encoded data signal of said sequence of signals exhibits a predetermined maximum bit length;

(b) said memory controller means includes means for storing each digitally encoded signal of said sequence of signals in a set of storage locations of said memory means at least equal in bit length to said predetermined maximum bit length; and (c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

28. The solid state memory of claim 24 wherein:

(a) said digitally encoded flight data are a sequence of signals with each data signal of said sequence having a maximum bit length;

(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;

(c) said memory controller means further includes means for supplying a second control signal for erasing data stored at storage locations corresponding to said address signals supplied to said memory means;

(d) said memory controller means further includes means for storing each digitally encoded data signal of said sequence of signals in a set of storage locations of said memory means at least equal in bit length to said predetermined maximum bit length; and (e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

29. The solid state memory of claim 3 wherein said digitally encoded flight data are a sequence of digitally encoded data signals and wherein:

(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;

(b) said memory controller means further includes means for supplying a second control signal for erasing data stored at storage locations corresponding to address signals supplied to said memory means;

(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and (d) said memory controller means further includes means for supplying said second control signal only for storage location addresses having a decimal equivalent value that is outside the range of consecutive integers that is defined by the decimal equivalent values of said first and second address for each of said address pairs.

30. The solid state memory of claim 29 wherein:

(a) each said digitally encoded data signal of said sequence of signals exhibits a predetermined maximum bit length;

(b) said memory controller means includes means for storing each digitally encoded signal of said sequence of signals in a set of storage locations of said memory means at least equal in bit length to said predetermined maximum bit length; and (c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

31. The solid state memory of claim 3 wherein:

(a) said digitally encoded flight data are a sequence of signals with each data signal of said sequence having a maximum bit length;

(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent vaues of said address signals to store said digitally encoded data signals of said sequence of signals in said memory means;

(c) said memory controller means further includes means for supplying a second control signal for erasing data stored at storage locations corresponding to said address signals supplied to said memory means;

(d) said memory controller means further includes means for storing each digitally encoded data signal of said sequence of signals in a set of storage locations of said memory means at least equal in bit length to said predetermined maximum bit length; and (e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

32. The solid state memory of claim 1 wherein:
(a) said memory controller means includes means for receiving digitally encoded data signals and for supplying said received digitally encoded signals to said memory means during said operational sequence of said memory controller means;
(b) said solid state memory includes means for temporarily storing said digitally encoded data signals supplied by said memory controller means to said memory means;
(c) a predetermined set of said plurality of storage locations of said memory means is dedicated for storing the addresses of other storage locations within said memory that do not properly store digitally encoded data coupled thereto when said controller means supplies said control signal to said memory means; and
(d) said memory controller means includes means for: (1) reading the data stored in the storage locations being addressed each time said memory controller means supplies said control signal to said memory means, (2) comparing the data read from said addressed storage locations with the data stored in said means for temporarily storing said data signals, (3) storing the addresses of addressed storage locations in said predetermined set of dedicated storage locations of said memory means when said data read from said addressed storage locations does not correspond to said data stored in said means for temporarily storing said data signals, (4) comparing each of said address signals supplied by said memory controller means with said addresses stored in said predetermined set of dedicated storage locations, and (5) generating a different address signal each time said address supplied by said memory controller means is identical to one of said addresses stored in said predetermined set of dedicated storage locations.

33. The solid state memory of claim 32 wherein said memory means, said means for temporarily storing said digitally encoded data signals and said memory controller means are contained within an environmental housing to thermally insulate said memory means, said means for temporarily storing said digitally encoded data and said memory controller means from the surrounding environment, and wherein said switch means is located outside said environmental housing.

34. The solid state memory of claim 32 wherein said memory controller means further includes means responsive to an applied interrupt signal for interrupting said operational sequence of said memory controller means, said crash survivable solid state memory comprising power monitor means for monitoring an applied signal representative of the operating potential supplied to said input terminal of said switch means, said power monitor means including means for supplying said interrupt signal to said memory controller means when the level of said applied signal is less than a predetermined value.

35. The solid state memory of claim 34 wherein said memory means, said means for temporarily storing said digitally encoded data signals and said memory controller means are contained within an environmental housing to thermally insulate said memory means, said means for temporarily storing said digitally encoded data and said memory controller means from the surrounding environment, and wherein said switch means and said power monitor means are located outside said environmental housing.

36. The solid state memory of claim 34 wherein said memory means includes means responsive to said control signal for enabling digital data transfer between said memory controller means and said selectively aaccessed storage locations when the magnitude of said control signal is within a predetermined range and for disabling digital data transfer between said memory controller means and said selectively accessed storage locations when said magnitude of said control signal is outside said predetermined range, said solid state memory further comprising memory protection means connected for receiving said interrupt signal supplied by said power monitor means, said memory protection means including means for supplying said control signal to said memory means at a magnitude within said predetermined range when said interrupt signal is not supplied to said memory protection means and means for supplying said control signal to said memory controller means at a magnitude that is outside said predetermined range when said interrupt signal is supplied to said memory protection means.

37. The solid state memory of claim 36 wherein said memory means, said memory protection means, said means for temporarily storing said digitally encoded data and said memory controller means are contained within an environmental housing to thermally insulate said memory means, said memory protection means, said means for temporarily storing said digitally encoded data and said memory controller means from the surrounding environment, and wherein said switch means and said power monitor means are located outside said environmental housing.

38. The solid state memory of claim 36 wherein said memory controller means is responsive to a reset signal for initializing said operational sequence of said memory controller means and said power monitor means further includes means responsive to said electrical potential supplied at said output terminal of said switch means for supplying said reset signal to said memory controller means when said operating potential for said memory means is not present at said output terminal of said switch means for a predetermined period of time.

39. The solid state memory of claim 38 wherein said memory means, said means for temporarily storing said digitally encoded data and said memory controller means are contained within an environmental housing to thermally insulate said memory means, said means for temporarily storing said digitally encoded data and said memory controller means from the surrounding environment, and wherein said switch means and said power monitor means are outside said environmental housing.

40. The solid state memory of claim 36 wherein said memory controller means is responsive to a reset signal for initializing said operational sequence of said memory controller means and said power monitor means further comprises means responsive to said operating potential supplied to said input terminal of said switch means for supplying a reset signal to said memory controller means each time said operating potential is supplied to said input terminal of said switch means.

41. The solid state memory of claim 40 wherein said memory means, said means for temporarily storing said digitally encoded data and said memory controller means are contained within an environmental housing to thermally insulate said memory means, said means for temporarily storing said digitally encoded data and said memory controller means from the surrounding environment, and wherein said switch means and said power monitor means are mounted outside said environmental housing.

42. The solid state memory of claim 40 wherein said power monitor means further includes means responsive to said electrical potential supplied at said output terminal of said switch means for supplying said reset signal to said memory controller means when said operating potential for said memory means is not present at said output terminal of said switch means for a predetermined period of time.

43. The solid state memory of claim 42 wherein said memory means, said means for temporarily storing said digital data and said memory controller means are contained within an environmental housing to thermally insulate said memory means, said means for temporarily storing said digital data and said memory controller means from the surrounding environment, and wherein said switch means is mounted outside said environmental housing.

44. The solid state memory of claim 40 wherein said digitally encoded flight data are a sequence of digitally encoded data signals and wherein:
   (a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
   (b) said memory controller means further includes means for supplying a second control signal for erasing data stored at storage locations corresponding to address signals supplied to said memory means;
   (c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
   (d) said memory controller means further includes means for supplying said second control signal only for storage location addresses having a decimal equivalent value that is outside the range of consecutive integers that is defined by the decimal equivalent values of said first and second address for each of said address pairs.

45. The solid state memory of claim 44 wherein:
   (a) each said digitally encoded data signal of said sequence of signals exhibits a predetermined maximum bit length;
   (b) said memory controller means includes means for storing each digitally encoded signal of said sequence of signals in a set of storage locations of said memory means at least equal in bit length to said predetermined maximum bit length; and
   (c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

46. The solid state memory of claim 36 wherein:
   (a) said digitally encoded flight data are a sequence of signals with each data signal of said sequence having a maximum bit length;
   (b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;
   (c) said memory controller means further includes means for supplying a second control signal for erasing data stored at storage locations corresponding to said address signals supplied to said memory means;
   (d) said memory controller means further includes means for storing each digitally encoded data signal of said sequence of signals in a set of storage locations of said memory means at least equal in bit length to said predetermined maximum bit length; and
   (e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

47. The solid state memory of claim 34 wherein said memory controller means is responsive to a reset signal for initializing said operational sequence of said memory controller means and said power monitor means further includes means responsive to said electrical potential supplied at said output terminal of said switch means for supplying said reset signal to said memory controller means when said operating potential for said memory means is not present at said output terminal of said switch means for a predetermined period of time.

48. The solid state memory of claim 47 wherein said memory means, said means for temporarily storing said digitally encoded data and said memory controller means are contained within an environmental housing to thermally insulate said memory means, said means for temorarily storing said digitally encoded data and said memory controller means from the surrounding environment, and wherein said switch means and said power monitor means are outside said environmental housing.

49. The solid state memory of claim 34 wherein said switch controller means is responsive to a reset signal for initializing said operational sequence of said memory controller means and said power monitor means further comprises means responsive to said operating potential supplied to said input terminal of said switch means for supplying a reset signal to said memory controller means each time said operating potential is supplied to said input terminal of said switch means.

50. The solid state memory of claim 49 wherein said memory means, said means for temporarily storing said digitally encoded data and said memory controller means are contained within an environmental housing to thermally insulate said memory means, said means for temporarily storing said digitally encoded data and said memory controller means from the surrounding environment, and wherein said switch means and said power monitor means are mounted outside said environmental housing.

51. The solid state memory of claim 49 wherein said power monitor means further includes means responsive to said electrical potential supplied at said output terminal of said switch means for supplying said reset signal to said memory controller means when said operating potential for said memory means is not present at said output terminal of said switch means for a predetermined period of time.

52. The solid state memory of claim 51 wherein said memory means, said means for temporarily storing said digital data and said memory controller means are contained within an environmental housing to thermally insulate said memory means, said means for temporarily storing said digital data and said memory controller means from the surrounding environment, and wherein said switch means is mounted outside said environmental housing.

53. The solid state memory of claim 34 wherein said digitally encoded flight data are a sequence of digitally encoded data signals and wherein:
(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
(d) said memory controller means further includes means for supplying said second control signal only for storage location addresses having a decimal equivalent value that is outside the range of consecutive integers that is defined by the decimal equivalent values of said first and second address for each of said address pairs.

54. The solid state memory of claim 53 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

55. The solid state memory of claim 34 wherein:
(a) said digitally encoded flight data are a sequence of signals with each data signal of said sequence having a maximum bit length;
(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;
(c) said memory controller means further includes means for supplying a second control signal for erasing data stored at storage locations corresponding to said address signals supplied to said memory means;
(d) said memory controller means further includes means for storing each digitally encoded data signal of said sequence of signals in a set of storage locations of said memory means at least equal in bit length to said predetermined maximum bit length; and
(e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

56. The solid state memory of claim 32 wherein said digitally encoded flight data are a sequence of digitally encoded data signals and wherein:
(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
(d) said memory controller means further includes means for supplying said second control signal only for storage location addresses having a decimal equivalent value that is outside the range of consecutive integers that is defined by the decimal equivalent values of said first and second address for each of said address pairs.

57. The solid state memory of claim 56 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

58. The solid state memory of claim 32 wherein:
(a) said digitally encoded flight data are a sequence of signals with each data signal of said sequence having a maximum bit length;
(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;
(c) said memory controller means further includes means for supplying a second control signal for erasing data stored at storage locations corresponding to said address signals supplied to said memory means;
(d) said memory controller means further includes means for storing each digitally encoded data signal of said sequence of signals in a set of storage locations of said memory means at least equal in bit length to said predetermined maximum bit length; and
(e) said memory means is configured and arranged to supply said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

59. The solid state memory of claim 1 wherein said digitally encoded flight data are a sequence of digitally encoded data signals and wherein:
(a) the decimal equivalent values of the digitally encoded address signals supplied to said memory means by said memory controller means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of data signals in said memory means;
(b) said memory controller means further includes means for supplying a second control signal for erasing data stored at storage locations corresponding to address signals supplied to said memory means;
(c) a predetermined set of said plurality of storage locations of said memory means is reserved for storing address pairs consisting of a first address that corresponds to the storage location address at which a selected one of said digitally encoded data signals of said sequence of signals is stored and a second address that corresponds to the storage location address at which a subsequent digitally encoded data signal of said sequence of signals is stored; and
(d) said memory controller means further includes means for supplying said second control signal only for storage location addresses having a decimal equivalent value that is outside the range of consecutive integers that is defined by the decimal equivalent values of said first and second address for each of said address pairs.

60. The solid state memory of claim 59 wherein:
(a) each said digitally encoded data signal of said sequence of signals exhibits a predetermined maximum bit length;
(b) said memory controller means includes means for storing each digitally encoded signal of said sequence of signals in a set of storage locations of said memory means at least equal in bit length to said predetermined maximum bit length; and
(c) said memory means is configured and arranged to supply said second control signal for erasing a set of storage locations in said memory means prior to storage of each digitally encoded data signal of said sequence of said signals, said set of erased storage locations including storage locations that will store the next most digitally encoded data signal of said sequence of digitally encoded data signals.

61. The solid state memory of claim 1 wherein:
(a) said digitally encoded flight data are a sequence of signals with each data signal of said sequence having a maximum bit length;

(b) the decimal equivalent values of the digitally encoded address signals supplied to said memory means are a set of consecutive integers ranging from 0 to n and said operational sequence of said memory controller means includes repeatedly accessing the storage locations of said memory means in ascending order relative to said decimal equivalent values of said address signals to store said digitally encoded data signals of said sequence of signals in said memory means;

(c) said memory controller means further includes means for supplying a second control signal for erasing data stored at storage locations corresponding to said address signals supplied to said memory means;

(d) said memory controller means in configured and arranged to store each digitally encoded data signal of said sequence of signals in a set of storage locations of said memory means at least equal in bit length to said predetermined maximum bit length; and (e) said memory means includes means for supplying said second control signal to said memory means for erasing a set of storage locations in said memory means prior to storage of each particular digitally encoded data signal of said sequence, said set of erase storage locations including storage locations that will store the next most digitally encoded data signal of said sequence of digitally encoded data signals.

* * * * *